(12) United States Patent
Hazue

(10) Patent No.: US 9,929,041 B1
(45) Date of Patent: Mar. 27, 2018

(54) SEMICONDUCTOR DEVICE AND METHOD FOR MANUFACTURING SAME

(71) Applicant: Toshiba Memory Corporation, Minato-ku (JP)

(72) Inventor: Shunsuke Hazue, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/455,674

(22) Filed: Mar. 10, 2017

Related U.S. Application Data

(60) Provisional application No. 62/393,708, filed on Sep. 13, 2016.

(51) Int. Cl.
| | |
|---|---|
| *H01L 21/768* | (2006.01) |
| *H01L 27/11524* | (2017.01) |
| *H01L 27/11556* | (2017.01) |
| *H01L 27/11519* | (2017.01) |
| *H01L 27/1157* | (2017.01) |
| *H01L 23/522* | (2006.01) |
| *H01L 23/528* | (2006.01) |
| *H01L 23/532* | (2006.01) |

(52) U.S. Cl.
CPC .. *H01L 21/76825* (2013.01); *H01L 21/76816* (2013.01); *H01L 21/76877* (2013.01); *H01L 23/5226* (2013.01); *H01L 23/5283* (2013.01); *H01L 23/5329* (2013.01); *H01L 27/1157* (2013.01); *H01L 27/11519* (2013.01); *H01L 27/11524* (2013.01); *H01L 27/11556* (2013.01)

(58) Field of Classification Search
CPC ......... H01L 21/76825; H01L 27/11519; H01L 27/11524; H01L 27/1157
See application file for complete search history.

(56) References Cited

U.S. PATENT DOCUMENTS

| | | | |
|---|---|---|---|
| 8,742,466 B2 * | 6/2014 | Shim | H01L 27/11551 |
| | | | 257/211 |
| 9,230,987 B2 * | 1/2016 | Pachamuthu | H01L 27/11582 |
| 9,424,928 B2 * | 8/2016 | Hwang | G11C 5/025 |

(Continued)

FOREIGN PATENT DOCUMENTS

| | | |
|---|---|---|
| JP | 2011-166061 | 8/2011 |
| JP | 2013-187200 | 9/2013 |
| JP | 2016-46439 | 4/2016 |

*Primary Examiner* — William Coleman
(74) *Attorney, Agent, or Firm* — Oblon, McClelland, Maier & Neustadt, L.L.P.

(57) ABSTRACT

According to one embodiment, a semiconductor device includes a foundation layer, a stacked body, and an insulating layer. The stacked body provides on the foundation layer, the stacked body includes a plurality of electrode layers stacked with an insulator interposed. The stacked body includes a first stacked portion and a second stacked portion. The plurality of electrode layers of the second stacked portion has a plurality of terrace portions arranged in a staircase configuration by forming a level difference in a first direction. The insulating layer provides on the plurality of terrace portions, the insulating layer includes silicon oxide as a major component. The insulating layer includes an upper layer portion and a lower layer portion. An oxygen composition ratio of the upper layer portion is lower than an oxygen composition ratio of the lower layer portion.

20 Claims, 29 Drawing Sheets

(56) References Cited

U.S. PATENT DOCUMENTS

| | | |
|---|---|---|
| 9,601,577 B1 * | 3/2017 | Lee .................. H01L 27/11578 |
| 9,666,592 B2 * | 5/2017 | Yun .................... H01L 27/1157 |
| 9,704,801 B1 * | 7/2017 | Sonehara ............. H01L 23/528 |
| 2011/0201167 A1 | 8/2011 | Satonaka et al. |
| 2013/0234232 A1 | 9/2013 | Yahashi |
| 2016/0056165 A1 | 2/2016 | Imamura |

* cited by examiner

SEMICONDUCTOR DEVICE AND METHOD FOR MANUFACTURING SAME

CROSS-REFERENCE TO RELATED APPLICATIONS

This application is based upon and claims the benefit of priority from U.S. Provisional Patent Application 62/393,708 filed on Sep. 13, 2016; the entire contents of which are incorporated herein by reference.

FIELD

Embodiments described herein relate generally to a semiconductor device and a method for manufacturing the same.

BACKGROUND

To connect multiple electrode layers of a three-dimensional memory device to a control circuit, a staircase-shaped contact structure of the multiple electrode layers has been proposed. After patterning a portion of the stacked body including the multiple electrode layers (or sacrificial layers to be replaced with the electrode layers) and the multiple insulating layers into a staircase configuration, an insulating layer is formed on the staircase portion. Contact portions pierce the insulating layer and reach the staircase portion. Also, it has also been proposed to form a slit by collectively etching the stacked body and the insulating layer on the staircase portion for the processes or for electrical isolation.

DETAILED DESCRIPTION

Figure 1:
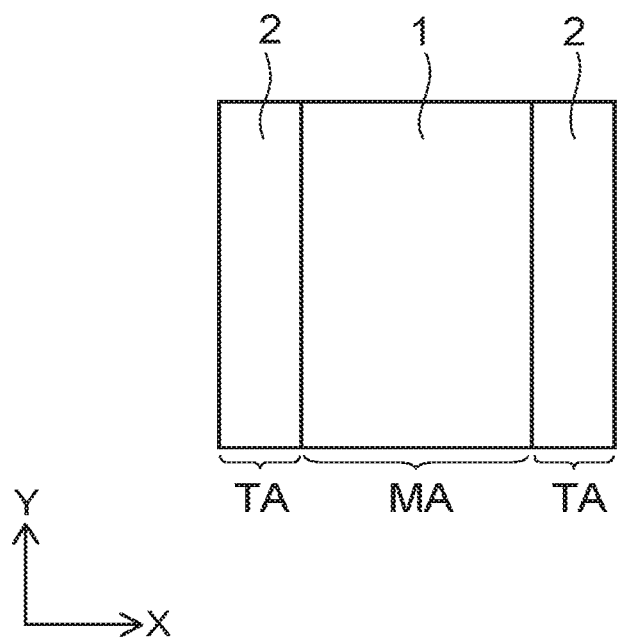
FIG. 1 is a schematic block plan view of a semiconductor device of an embodiment.

According to one embodiment, a semiconductor device includes a foundation layer, a stacked body, and an insulating layer. The stacked body provides on the foundation layer, the stacked body includes a plurality of electrode layers stacked with an insulator interposed. The stacked body includes a first stacked portion and a second stacked portion. The plurality of electrode layers of the second stacked portion has a plurality of terrace portions arranged in a staircase configuration by forming a level difference in a first direction. The insulating layer provides on the plurality of terrace portions, the insulating layer includes silicon oxide as a major component. The insulating layer includes an upper layer portion and a lower layer portion. An oxygen composition ratio of the upper layer portion is lower than an oxygen composition ratio of the lower layer portion.

Embodiment will now be described with reference to the drawings. In the respective drawings, like members are labeled with like reference numerals.

For example, a semiconductor memory device including a memory cell array having a three-dimensional structure is described as the semiconductor device in the embodiment.

FIG. 1 is a schematic block plan view of the semiconductor device of the embodiment.

Figure 2:
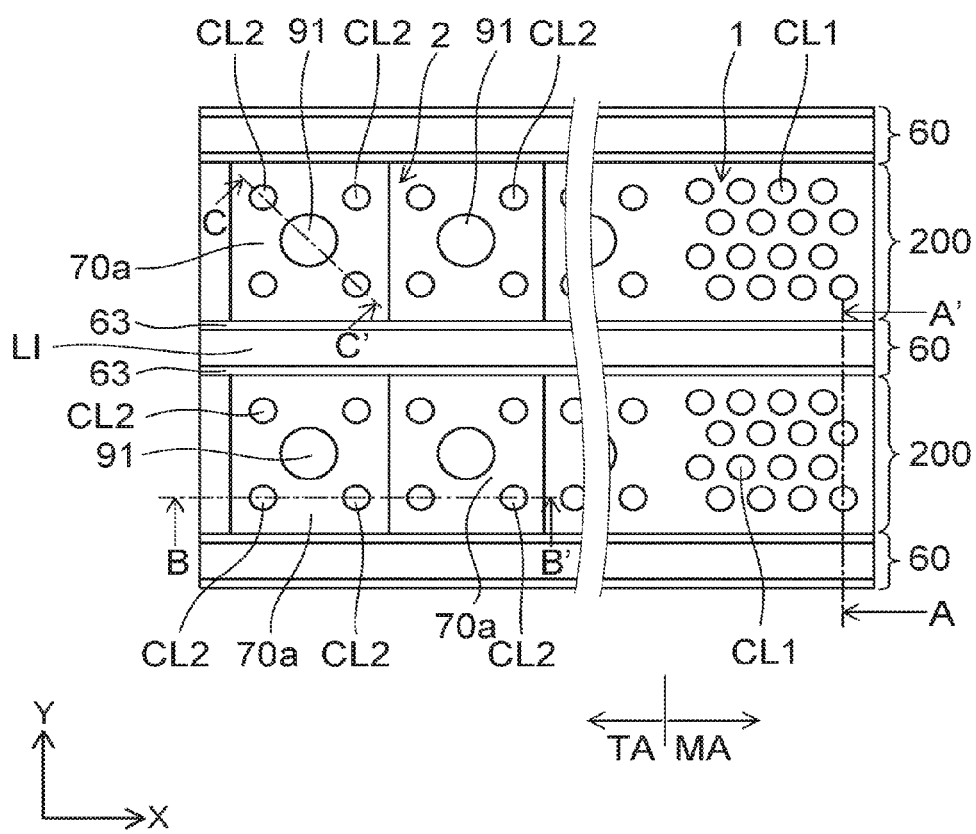
FIG. 2 is a schematic plan view of the semiconductor device of the embodiment.

FIG. 2 is a schematic plan view of the semiconductor device of the embodiment.

The semiconductor device of the embodiment includes a memory region MA and a terrace region (or a staircase region) TA. A memory cell array 1 is provided in the memory region MA. A staircase portion 2 is provided in the terrace region TA. The memory cell array 1 and the staircase portion 2 are provided on the same substrate.

Figure 3:
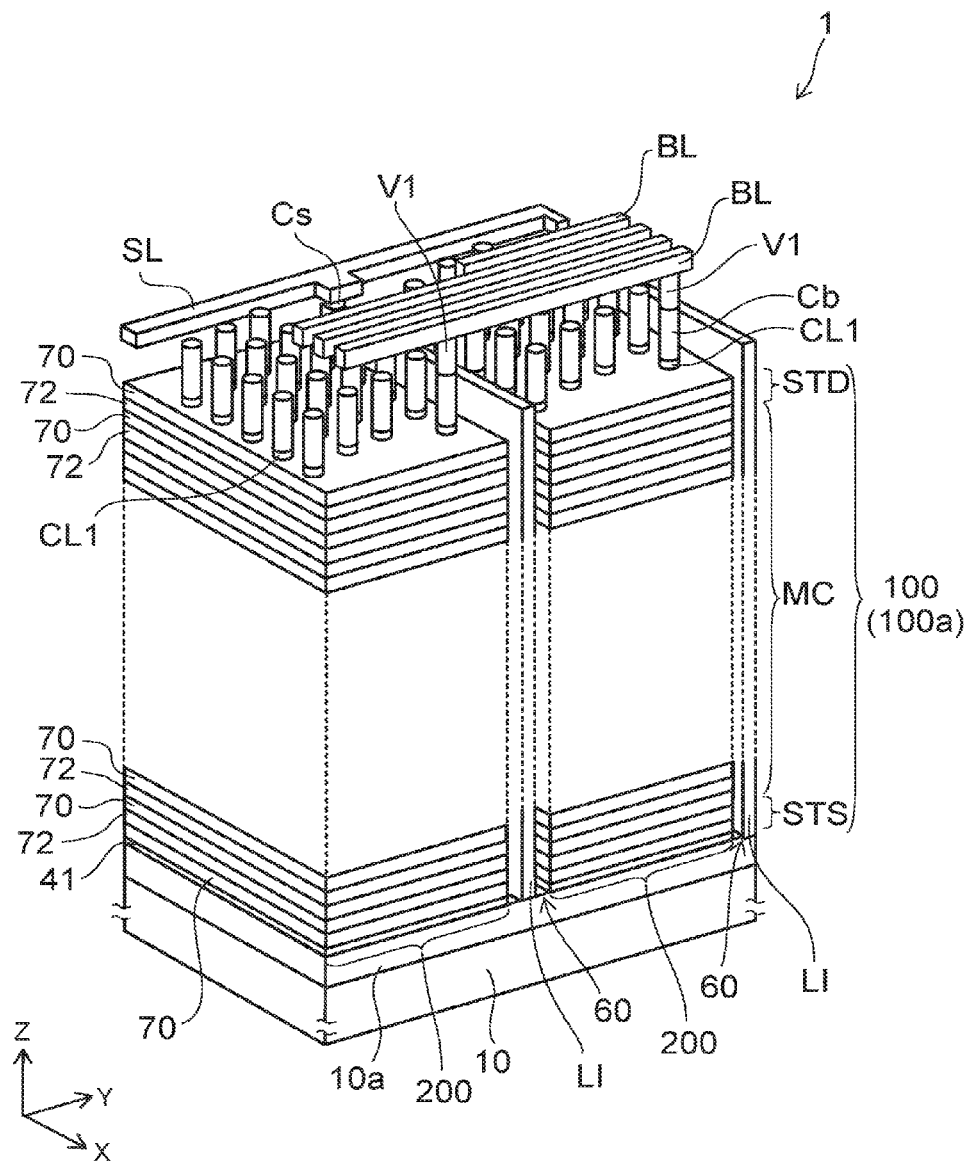
FIG. 3 is a schematic perspective view of the memory cell array of the embodiment.

FIG. 3 is a schematic perspective view of the memory cell array 1 of the embodiment.

Figure 4:
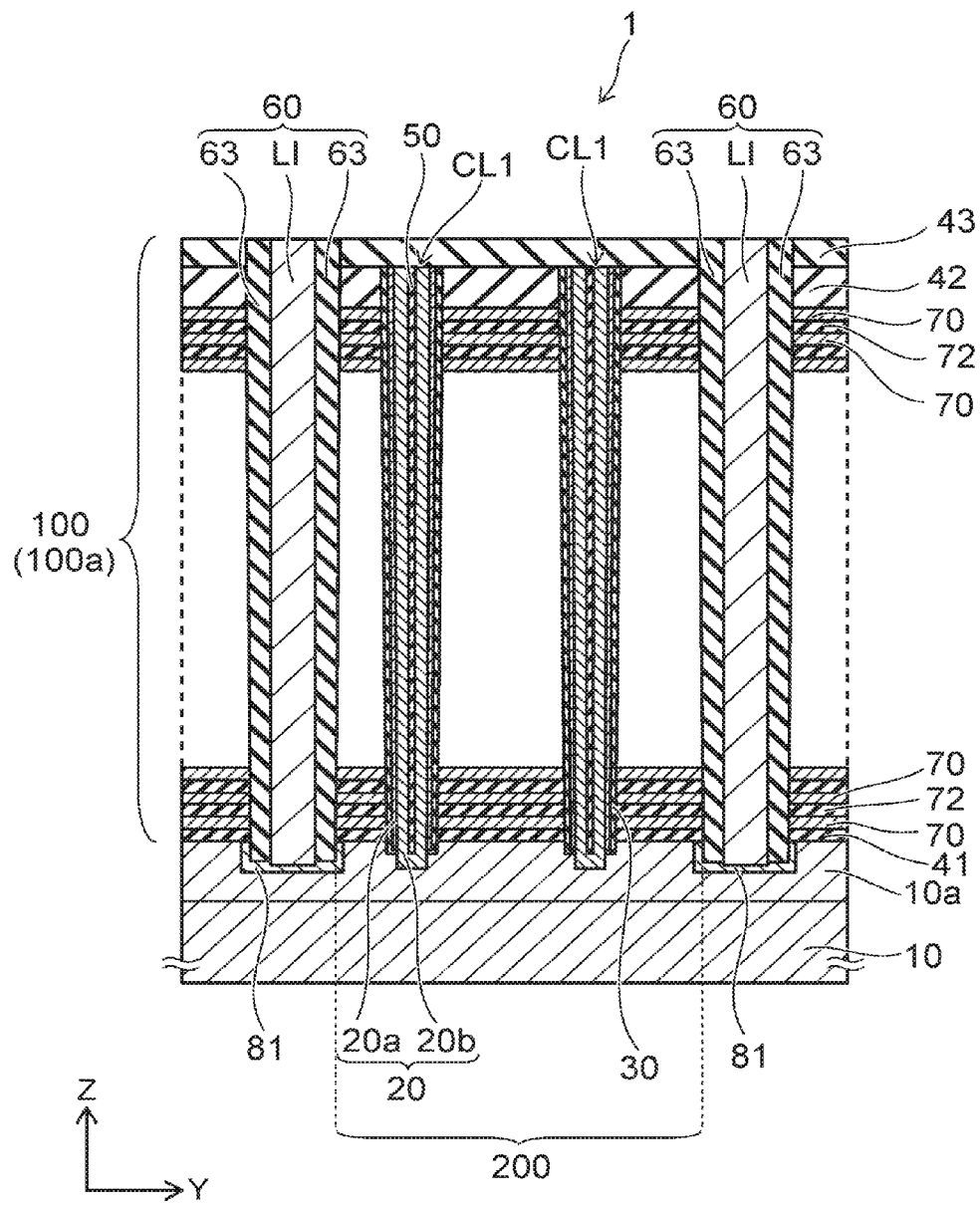
FIG. 4 is an A-A' cross-sectional view of FIG. 2.

FIG. 4 is an A-A' cross-sectional view of FIG. 2.

In FIG. 3, two mutually-orthogonal directions parallel to a major surface of a substrate 10 are taken as an X-direction and a Y-direction; and a direction orthogonal to both the X-direction and the Y-direction is taken as a Z-direction (a stacking direction). The X-direction, the Y-direction, and the Z-direction shown in the other drawings correspond respectively to the X-direction, the Y-direction, and the Z-direction of FIG. 3.

The memory cell array 1 includes a substrate 10, a stacked body 100 provided on the substrate 10, multiple first columnar portions CL1, multiple separation portions 60, and upper layer interconnects provided above the stacked body 100. For example, bit lines BL and a source line SL are shown as the upper layer interconnects in FIG. 3.

The substrate 10 is provided in the memory region MA and the terrace region TA; and the stacked body 100 also is provided in the memory region MA and the terrace region TA. The portion of the stacked body 100 provided in the memory region MA is taken as a first stacked portion 100a; and the portion of the stacked body 100 provided in the terrace region TA is taken as a second stacked portion 100b.

The multiple first columnar portions CL1 are disposed in the memory region MA. The first columnar portions CL1 are formed in substantially circular columnar configurations extending through the first stacked portion 100a in the stacking direction of the first stacked portion 100a (the Z-direction).

As shown in FIG. 2, for example, the multiple first columnar portions CL1 have a staggered arrangement. Or, the multiple first columnar portions CL1 may have a square lattice arrangement along the X-direction and the Y-direction.

As shown in FIG. 2, the separation portions 60 extend in the X-direction through the memory region MA and the terrace region TA and divide the stacked body 100 into multiple blocks (or finger portions) 200 in the Y-direction.

As shown in FIG. 3, the multiple bit lines BL are provided above the first stacked portion 100a. The multiple bit lines BL are, for example, metal films extending in the Y-direction. The multiple bit lines BL are separated from each other in the X-direction.

The upper end portions of semiconductor bodies 20 of the first columnar portions CL1 described below are connected to the bit lines BL via contacts Cb and contacts V1 shown in FIG. 3.

The multiple first columnar portions CL1 are connected to one common bit line BL. The multiple first columnar portions CL1 that are connected to the common bit line BL include one first columnar portion CL1 selected from each block 200 divided in the Y-direction by the separation portions 60.

As shown in FIG. 4, the first stacked portion 100a includes multiple electrode layers 70 stacked on the substrate 10. The multiple electrode layers 70 are stacked, with insulating layers (insulating bodies) 72 interposed, in a direction (the Z-direction) perpendicular to a major surface of the substrate 10. The electrode layer 70 is a metal layer. The electrode layer 70 is, for example, a tungsten layer including tungsten as a major component or a molybdenum layer including molybdenum as a major component. The insulating layer 72 is a silicon oxide layer including silicon oxide as a major component.

The substrate 10 is, for example, a silicon substrate; and an active region 10a is provided on the front surface side of the substrate 10. The active region 10a is, for example, a P-type silicon region (a P-type well).

An insulating layer 41 is provided on the front surface of the active region 10a. The electrode layer 70 of the lowermost layer is provided on the insulating layer 41. An insulating layer 42 is provided on the electrode layer 70 of the uppermost layer; and an insulating layer 43 is provided on the insulating layer 42. The insulating layer 43 covers the upper ends of the first columnar portions CL1.

Figure 5A:
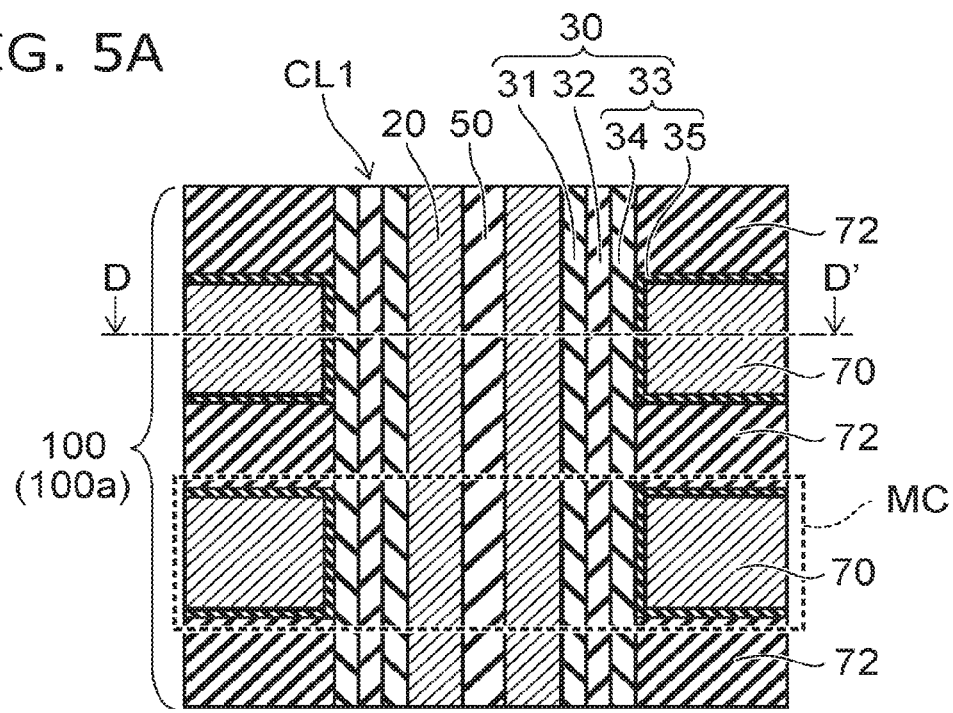
FIG. 5A is an enlarged cross-sectional view of one portion of FIG. 4.

FIG. 5A is an enlarged cross-sectional view of one portion of FIG. 4.

Figure 5B:
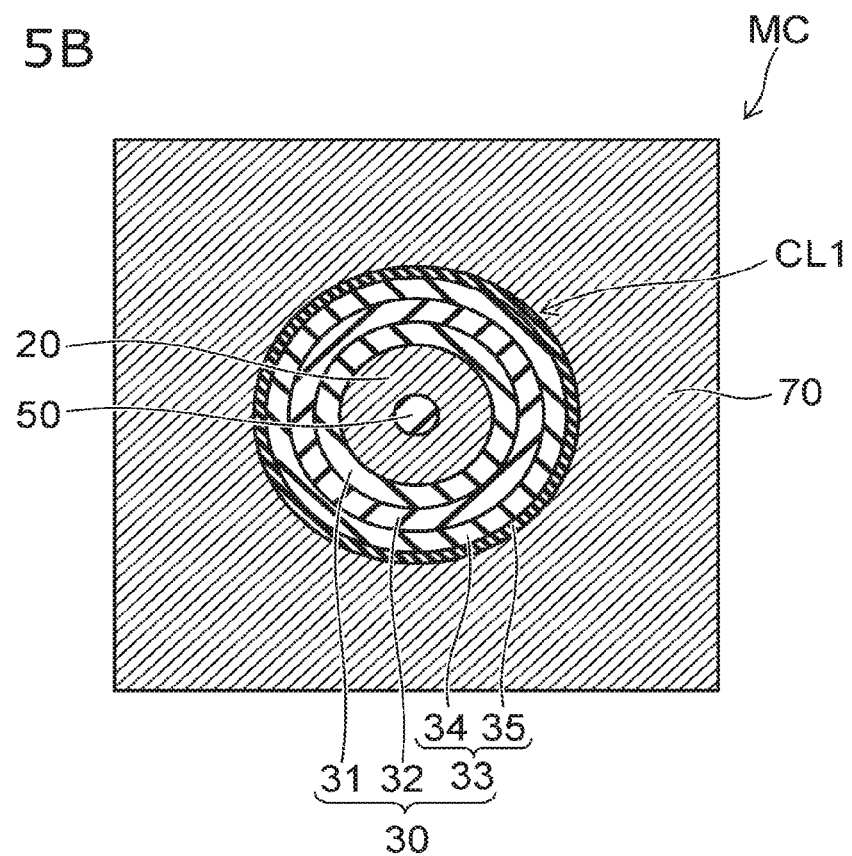
FIG. 5B is a D-D' cross-sectional view of FIG. 5A.

FIG. 5B is a D-D' cross-sectional view of FIG. 5A.

The first columnar portion CL1 includes a stacked film (a memory film) 30, the semiconductor body 20, and a core film 50 that is insulative.

The semiconductor body 20 extends to be continuous in a pipe-like configuration through the first stacked portion 100a in the stacking direction (the Z-direction). The stacked film 30 is provided between the semiconductor body 20 and the electrode layers 70 and surrounds the semiconductor body 20 from the outer perimeter side. The core film 50 is provided on the inner side of the semiconductor body 20 having the pipe-like configuration. The upper end portion of the semiconductor body 20 is connected to the bit line BL via the contact Cb and the contact V1 shown in FIG. 3. As shown in FIG. 4, the lower end portion of the semiconductor body 20 contacts the active region 10a.

As shown in FIG. 5A and FIG. 5B, the stacked film 30 includes a tunneling insulating film 31, a charge storage film (a charge storage portion) 32, and a blocking insulating film 33.

The tunneling insulating film 31 is provided between the semiconductor body 20 and the charge storage film 32. The charge storage film 32 is provided between the tunneling insulating film 31 and the blocking insulating film 33. The blocking insulating film 33 is provided between the charge storage film 32 and the electrode layer 70.

The semiconductor body 20, the stacked film 30, and the electrode layer 70 are included in a memory cell MC. The memory cell MC has a vertical transistor structure in which the electrode layer 70 surrounds, with the stacked film 30 interposed, the periphery of the semiconductor body 20.

In the memory cell MC having the vertical transistor structure, the semiconductor body 20 is, for example, a channel body of silicon; and the electrode layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film and includes, for example, a silicon nitride film. Or, the charge storage film 32 may be a conductive floating gate surrounded with an insulator.

The tunneling insulating film 31 is used as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of the charge from the electrode layer 70 into the first columnar portion CL1.

The blocking insulating film 33 includes a first blocking film 34 and a second blocking film 35. The first blocking film 34 is, for example, a silicon oxide film. The second blocking film 35 is a metal oxide film having a higher dielectric constant than that of the silicon oxide film. For example, an aluminum oxide film, a zirconium oxide film, and a hafnium oxide film may be used as the metal oxide film.

The first blocking film 34 is provided between the charge storage film 32 and the second blocking film 35. The second blocking film 35 is provided between the first blocking film 34 and the electrode layer 70.

The tunneling insulating film 31, the charge storage film 32, and the first blocking film 34 extend to be continuous in the stacking direction of the stacked body 100 (the Z-direction).

The second blocking film 35 is provided also between the electrode layer 70 and the insulating layer 72. The second blocking film 35 is formed to be continuous along the upper surface of the electrode layer 70, the lower surface of the electrode layer 70, and the side surface of the electrode layer 70 on the stacked film 30 side. The second blocking film 35 is discontinuous in the stacking direction of the stacked body 100 and is divided.

Or, the second blocking film 35 may be formed to be continuous along the stacking direction without forming the second blocking film 35 between the electrode layer 70 and the insulating layer 72. Or, the blocking insulating film 33 may be a single-layer film continuous along the stacking direction.

A metal nitride film may be formed between the second blocking film 35 and the electrode layer 70 or between the insulating layer 72 and the electrode layer 70. The metal nitride film is, for example, a titanium nitride film and can function as a barrier metal, an adhesion layer, or a seed metal of the electrode layer 70.

As shown in FIG. 3, a drain-side selection transistor STD is provided at the upper layer portion of the first stacked portion 100a (the upper end portion of the first columnar portion CL1). A source-side selection transistor STS is provided at the lower layer portion of the first stacked portion 100a (the lower end portion of the first columnar portion CL1).

The electrode layer 70 of at least the uppermost layer functions as a control gate of the drain-side selection transistor STD. The electrode layer 70 of at least the lowermost layer functions as a control gate of the source-side selection transistor STS.

The multiple memory cells MC are provided between the drain-side selection transistor STD and the source-side selection transistor STS. The multiple memory cells MC, the drain-side selection transistor STD, and the source-side selection transistor STS are connected in series via the semiconductor body 20 of the first columnar portion CL1 and are included in one memory string. For example, the memory strings have a staggered arrangement in a planar direction parallel to the XY plane; and the multiple memory cells MC are provided three-dimensionally in the X-direction, the Y-direction, and the Z-direction.

The separation portion 60 will now be described.

As shown in FIG. 2 and FIG. 4, the separation portion 60 includes an interconnect portion LI and an insulating film 63. The insulating film 63 is not illustrated in FIG. 3.

The interconnect portion LI spreads in the X-direction and the Z-direction and is, for example, a film including a metal. The insulating film 63 is provided on the side surface of the interconnect portion LI. As shown in FIG. 4, the insulating film 63 is provided between the first stacked portion 100a and the interconnect portion LI.

As shown in FIG. 4, multiple semiconductor regions 81 are formed in the front surface of the active region 10a. The lower end portions of the interconnect portions LI contact the semiconductor regions 81. The multiple semiconductor regions 81 are provided to correspond to the multiple interconnect portions LI. The multiple semiconductor regions 81 include an N-type semiconductor region 81. The multiple interconnect portions LI include the interconnect portion LI connected to the N-type semiconductor region 81. The upper end of the interconnect portion LI connected to the N-type semiconductor region 81 is connected to the source line SL via a contact Cs shown in FIG. 3.

By controlling the potential applied to the electrode layer 70 of the lowermost layer, an N-channel (an inversion layer) can be induced in the front surface of the P-type active region 10a between the N-type semiconductor region 81 and the lower end portion of the semiconductor body 20; and a current can be caused to flow between the N-type semiconductor region 81 and the lower end portion of the semiconductor body 20. The electrode layer 70 of the lowermost layer functions as a control gate for inducing the channel in the front surface of the active region 10a; and the insulating layer 41 functions as a gate insulating film. In a read operation, electrons are supplied from the interconnect portion LI to the semiconductor body 20 via the N-type semiconductor region 81 and the N-channel.

The terrace region TA will now be described.

Figure 6:
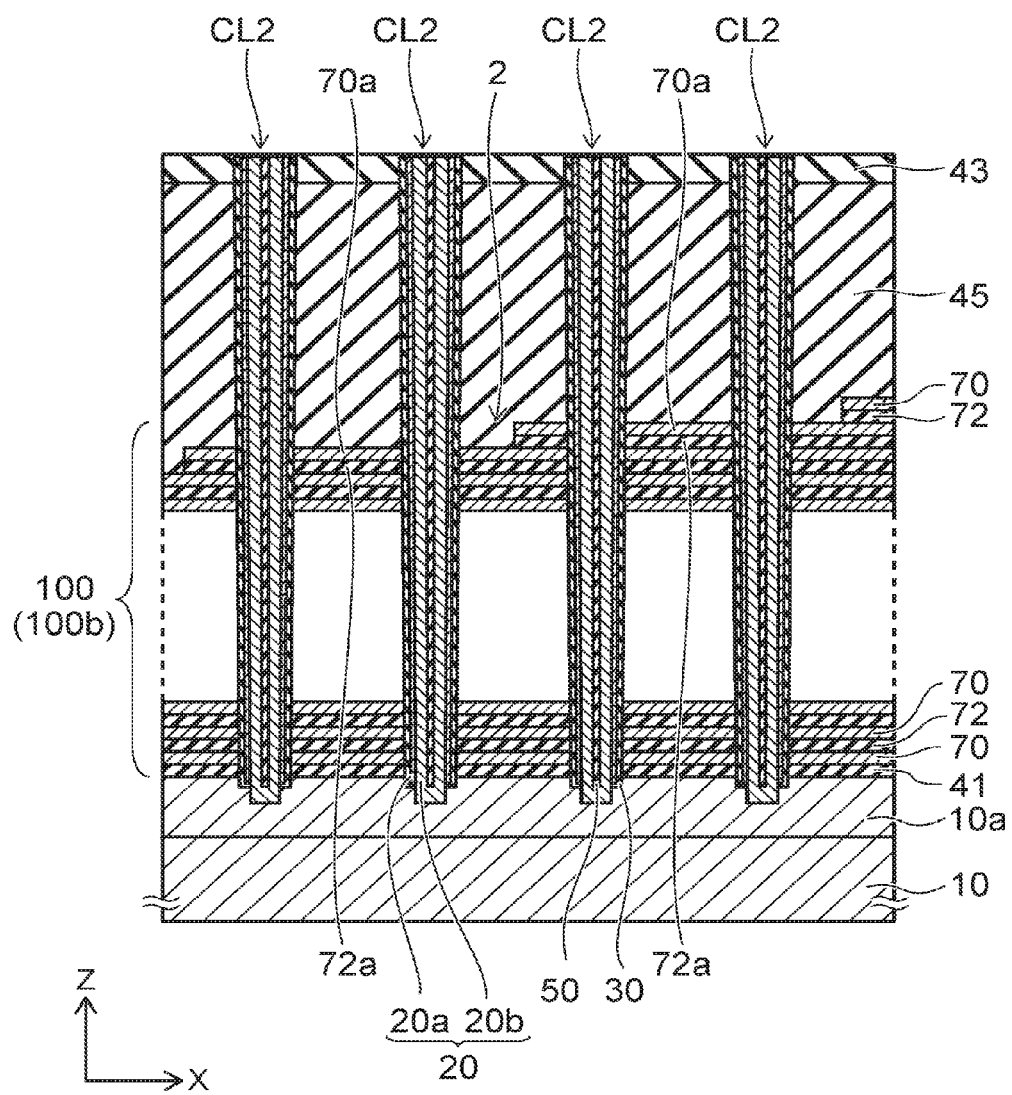
FIG. 6 is a B-B' cross-sectional view of FIG. 2.

FIG. 6 is a B-B' cross-sectional view of FIG. 2.

Figure 7:
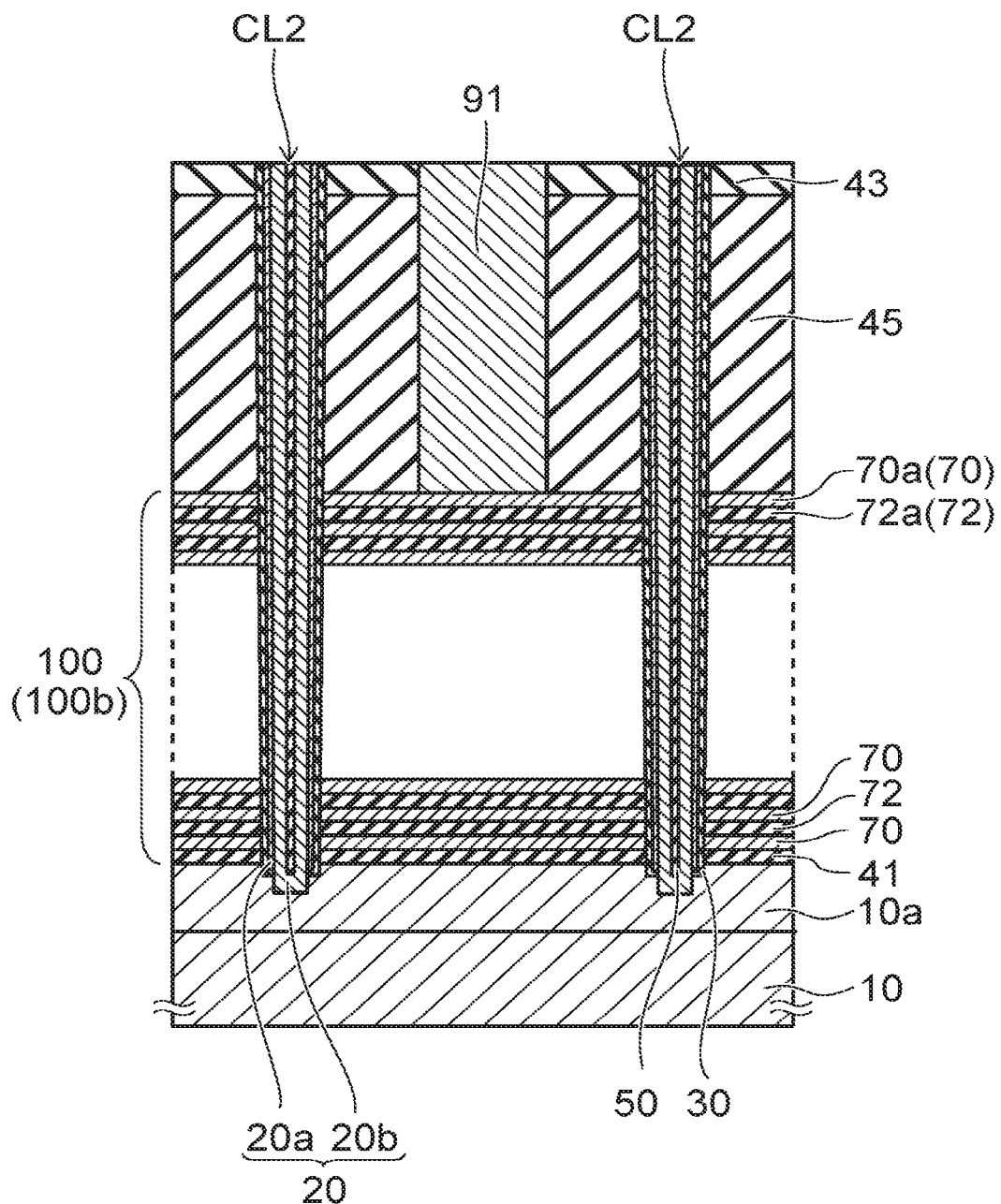
FIG. 7 is a C-C' cross-sectional view of FIG. 2.

FIG. 7 is a C-C' cross-sectional view of FIG. 2.

The stacked body 100 and the separation portions 60 extend in the X-direction from the memory region MA to the terrace region TA. The substrate 10 that includes the active region 10a also is provided in the terrace region TA.

The separation portions 60 divide the second stacked portion 100b of the terrace region TA into the multiple blocks (or finger portions) 200 in the Y-direction.

As shown in FIG. 6, the multiple electrode layers 70 of the second stacked portion 100b have multiple terrace portions 70a arranged in a staircase configuration by forming a level difference along the X-direction. The staircase portion 2 is formed of the multiple terrace portions 70a.

All of the electrode layers 70 and insulating layers 72 above the terrace portions 70a are removed and do not remain. The electrode layers 70 of the other layers do not overlap above each of the terrace portions 70a.

The multiple insulating layers 72 of the second stacked portion 100b also are patterned into a staircase configuration; and the multiple insulating layers 72 have multiple terrace portions 72a arranged in a staircase configuration by forming a level difference along the X-direction. The terrace portions 72a of the insulating layers 72 are stacked on the terrace portions 70a of the electrode layers 70.

An insulating layer 45 is provided on the staircase portion 2. The insulating layer 45 fills the level differences of the staircase portion 2 and eliminates or relaxes the level difference between the second stacked portion 100b and the first stacked portion 100a. The insulating layer 43 is provided on the insulating layer 45.

Multiple second columnar portions CL2 are disposed in the terrace region TA. The second columnar portions CL2 are formed in substantially circular columnar configurations extending in the stacking direction (the Z-direction) through the insulating layer 45 and through the second stacked portion 100b under the insulating layer 45.

As shown in FIG. 6, the second columnar portions CL2 pierce the insulating layer 43, the insulating layer 45, and the second stacked portion 100b and reach the substrate 10. The second columnar portions CL2 pierce the terrace portions 70a.

At least one second columnar portion CL2 is disposed at one terrace portion 70a. In the example shown in FIG. 2, for example, four second columnar portions CL2 are disposed at one terrace portion 70a.

As shown in FIG. 2, the multiple first columnar portions CL1 of the memory region MA are arranged more densely than the multiple second columnar portions CL2 of the terrace region TA.

For example, the second columnar portions CL2 are formed simultaneously when forming the first columnar portions CL1 and include the stacked film (the insulating film) 30, the semiconductor body 20, and the core film 50 similarly to the first columnar portions CL1 as shown in FIG. 6.

The upper end portions of the semiconductor bodies 20 of the second columnar portions CL2 are not connected to the upper layer interconnects and are not connected electrically to anything. The second columnar portions CL2 do not function as components of the memory cells or the selection transistors, and function as simple columns supporting the multiple insulating layers 72 when the gaps described below are formed.

As shown in FIG. 2 and FIG. 7, contact portions 91 are provided on the terrace portions 70a. At least one contact portion 91 is disposed at one terrace portion 70a. The multiple contact portions 91 are provided on the staircase portion 2 to correspond to the multiple terrace portions 70a.

The contact portion 91 is a conductive body having a substantially circular columnar configuration. The contact portion 91 is a metal body and includes, for example, tungsten or molybdenum as a major component. The diameter of the contact portion 91 is larger than the diameter of the first columnar portion CL1 and the diameter of the second columnar portion CL2.

The contact portions 91 extend through the insulating layer 45 in the stacking direction of the stacked body 100 and contact the terrace portions 70a. The peripheries of the contact portions 91 are surrounded with the insulating layer 45.

The contact portions 91 are connected to not-illustrated upper layer interconnects. For example, the upper layer interconnects are electrically connected to a control circuit formed in the front surface of the substrate 10. The potentials of the electrode layers 70 of the memory cell array 1 are controlled via the contact portions 91 and the terrace portions 70a.

Figure 26A:
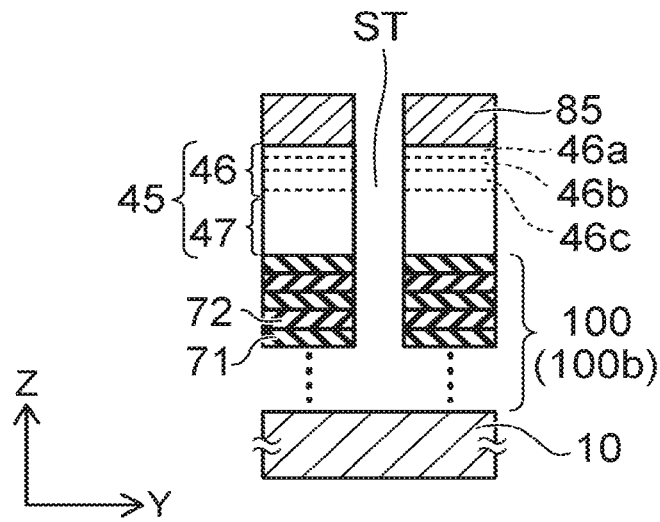
Figure 26B:
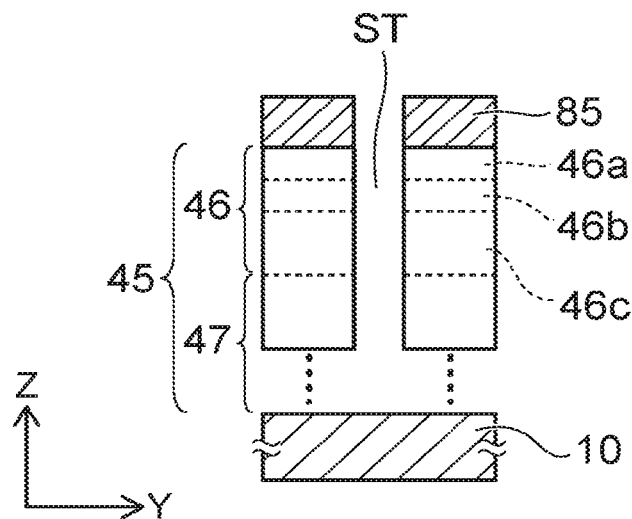

FIG. 26B is a cross-sectional view along the X-direction of the staircase portion 2.

The insulating layer 45 that is provided on the staircase portion 2 including the multiple terrace portions 70a is a silicon oxide layer including silicon oxide as a major component.

The oxygen composition ratio (atomic percent) of the insulating layer 45 is nonuniform in the thickness direction of the insulating layer 45; and the oxygen composition ratio of the insulating layer 45 has a gradient in the thickness direction. The oxygen composition ratio of an upper layer portion 46 of the insulating layer 45 is lower than the oxygen composition ratio of a lower layer portion 47 of the insulating layer 45. Here, the upper layer portion 46 includes a region higher than the position of half of the insulating layer 45 in the thickness direction.

For example, the oxygen composition ratio of a region 46a including the upper surface of the upper layer portion 46 of the insulating layer 45 is lower than the oxygen composition ratio of a region 46b under the region 46a; and the oxygen composition ratio of the region 46b is lower than the oxygen composition ratio of a region 46c under the region 46b.

In FIG. 26B, the boundary between the region 46a and the region 46b, the boundary between the region 46b and the region 46c, and the boundary between the region 46c and the lower layer portion 47 are illustrated schematically by broken lines.

The lower surface of the insulating layer 45 has level differences along the level differences of the staircase portion 2. The upper surface of the insulating layer 45 is planarized. Accordingly, the thickness of the insulating layer 45 increases in steps from the upper level side toward the lower level side of the staircase portion 2.

The thickness of the upper layer portion 46 having a lower oxygen composition ratio than the lower layer portion 47 increases in steps or continuously from the upper level side toward the lower level side of the staircase portion 2. In other words, relatively, the thickness of the upper layer portion 46 on the terrace portions 70a on the lower level side is thicker than the thickness of the upper layer portion 46 on the terrace portions 70a on the upper level side.

For example, the insulating layer 45 is formed by chemical vapor deposition (CVD) using a gas including tetra ethyl ortho silicate (TEOS). Subsequently, for example, carbon or nitrogen is implanted into the upper layer portion 46 of the insulating layer 45 by ion implantation.

Accordingly, the carbon concentration (the number of carbon atoms per unit volume) of the upper layer portion 46 of the insulating layer 45 is higher than the carbon concentration of the lower layer portion 47. Or, the nitrogen concentration (the number of nitrogen atoms per unit volume) of the upper layer portion 46 of the insulating layer 45 is higher than the nitrogen concentration of the lower layer portion 47. By introducing carbon or nitrogen to the upper layer portion 46, the oxygen composition ratio of the upper layer portion 46 relatively is lower than the oxygen composition ratio of the lower layer portion 47.

A method for manufacturing the semiconductor device of the embodiment will now be described.

First, the processes for the first stacked portion 100a of the memory region MA will be described with reference to FIG. 8 to FIG. 18. FIG. 8 to FIG. 18 are cross-sectional views corresponding to the A-A' cross section of FIG. 2.

Figure 8:
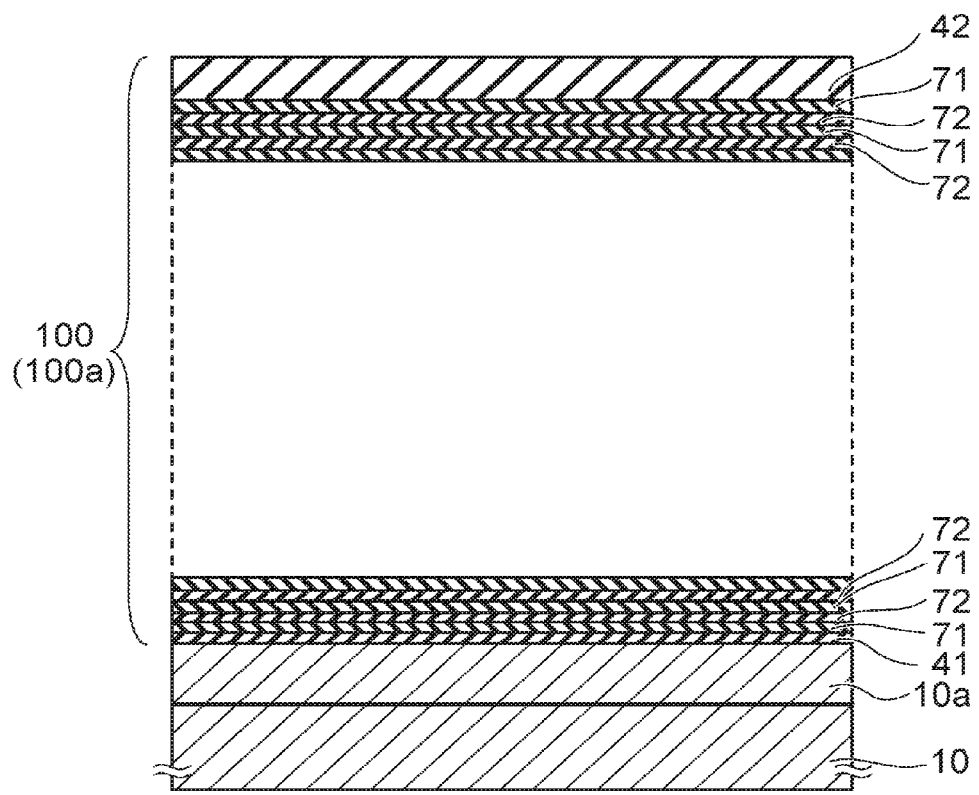
FIGS. 8 to 28B are schematic views showing a method for manufacturing the semiconductor device of the embodiment.

As shown in FIG. 8, the insulating layer 41 is formed on the active region 10a of the substrate 10. A sacrificial layer 71 as a first layer and the insulating layer 72 as a second layer are stacked alternately on the insulating layer 41. The process of alternately stacking the sacrificial layer 71 and the insulating layer 72 is repeated; and the multiple sacrificial layers 71 and the multiple insulating layers 72 are formed on the substrate 10. The insulating layer 42 is formed on the sacrificial layer 71 of the uppermost layer. For example, the sacrificial layers 71 are silicon nitride layers; and the insulating layers 72 are silicon oxide layers.

Figure 9:
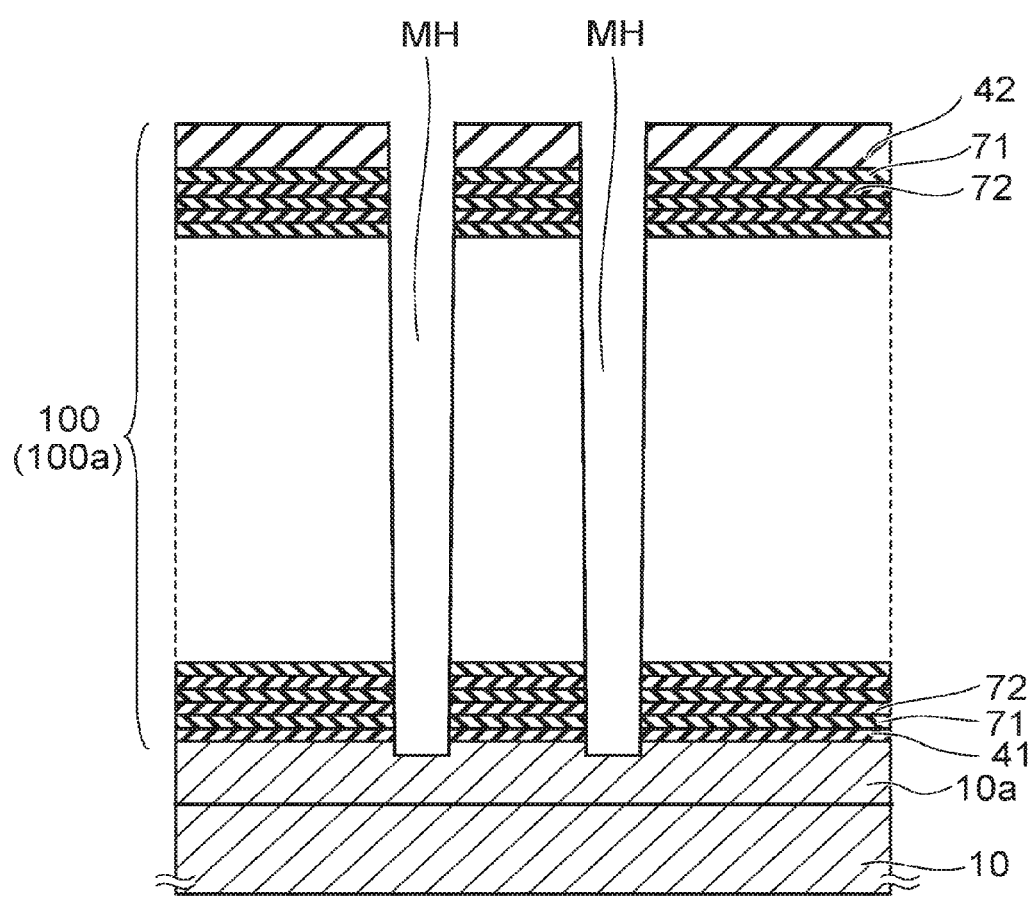

As shown in FIG. 9, multiple memory holes MH are formed in the first stacked portion 100a including the multiple sacrificial layers 71 and the multiple insulating layers 72. The memory holes MH are formed by reactive ion etching (RIE) using a not-illustrated mask layer. The memory holes MH pierce the insulating layer 42, the multiple sacrificial layers 71, the multiple insulating layers 72, and the insulating layer 41 and reach the active region 10a.

Figure 10:
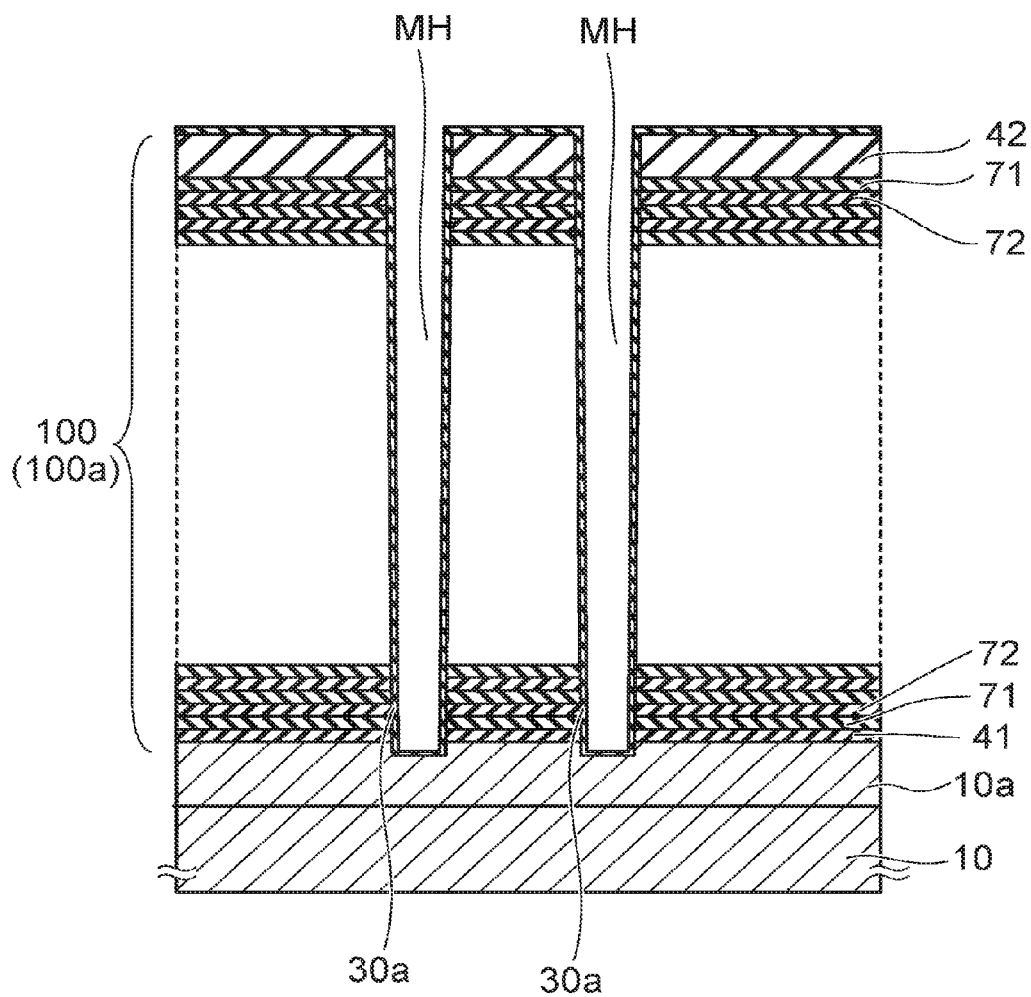

As shown in FIG. 10, a stacked film 30a is formed inside the memory holes MH. The stacked film 30a is formed conformally along the bottoms and side surfaces of the memory holes MH. The stacked film 30a includes, for example, the tunneling insulating film 31, the charge storage film 32, and the first blocking film 34 of the stacked film 30 shown in FIG. 5A and FIG. 5B. The first blocking film 34, the charge storage film 32, and the tunneling insulating film 31 are formed in order inside the memory holes MH.

Figure 11:
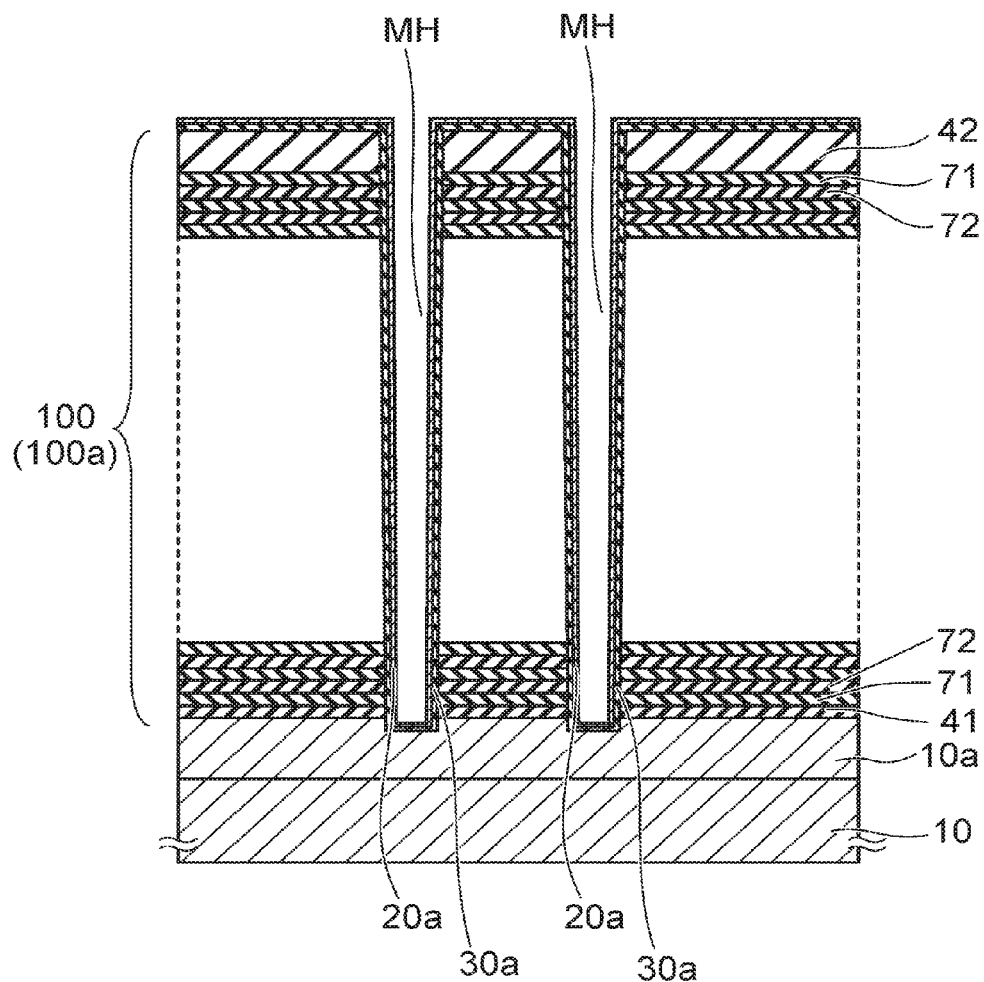

As shown in FIG. 11, cover silicon 20a is formed on the inner side of the stacked film 30a. The cover silicon 20a is formed conformally along the bottoms and side surfaces of the memory holes MH.

Figure 12:
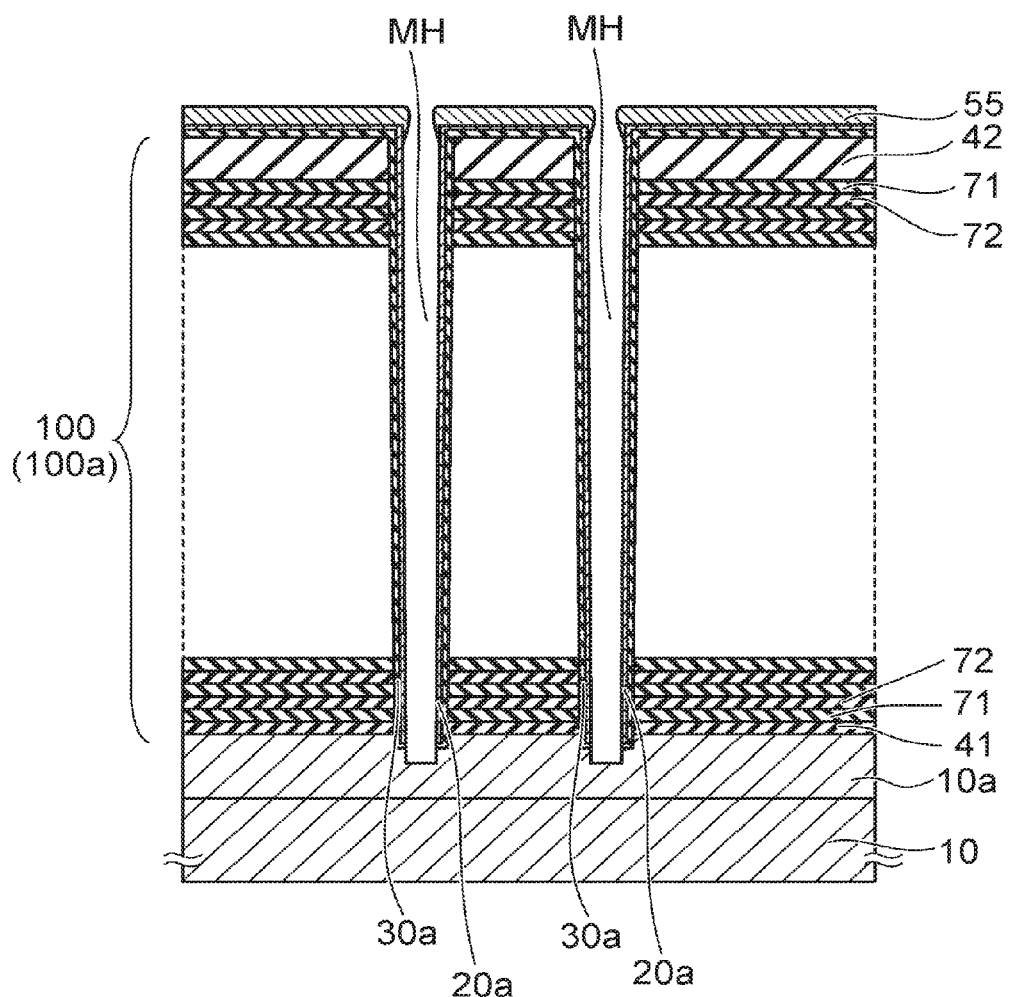

Then, as shown in FIG. 12, a mask layer 55 is formed on the insulating layer 42; and the cover silicon 20a and the stacked film 30a that are deposited on the bottoms of the memory holes MH are removed by RIE. In the RIE, the stacked film 30a that is formed on the side surfaces of the memory holes MH is covered with and protected by the cover silicon 20a and is not damaged by the RIE.

Figure 13:
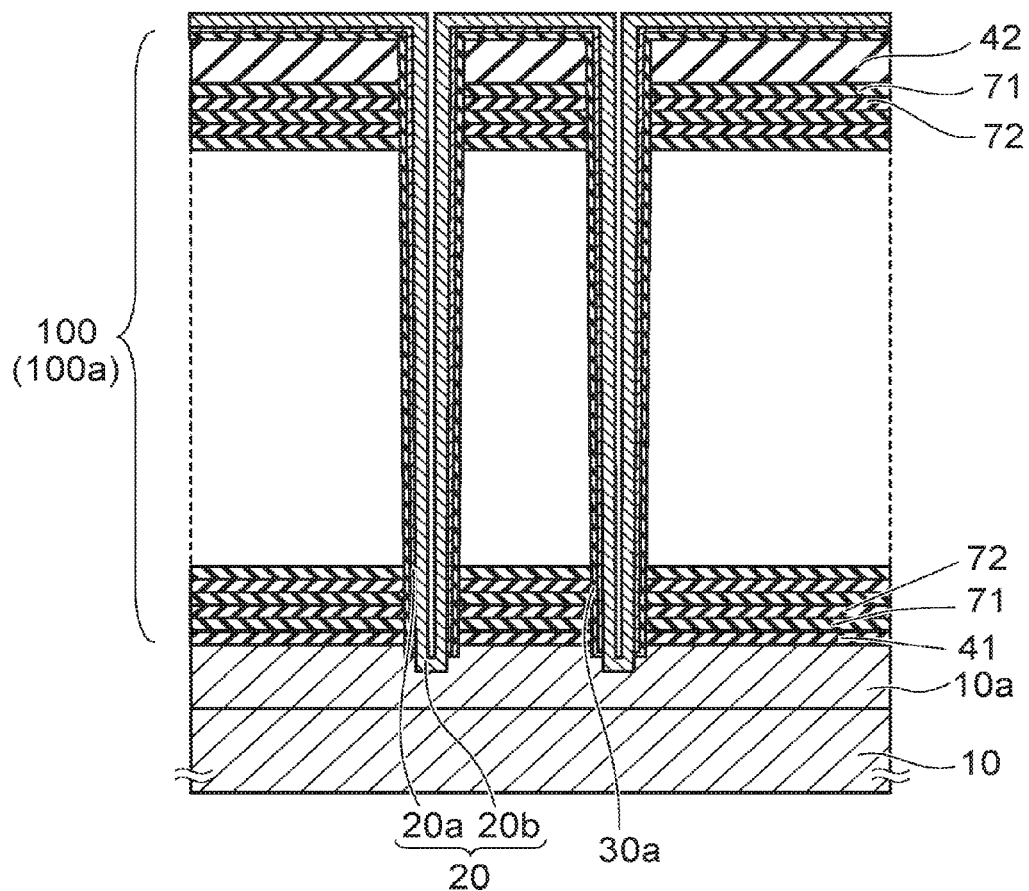

After removing the mask layer 55, a silicon body 20b is formed inside the memory holes MH as shown in FIG. 13. The silicon body 20b is formed on the side surface of the cover silicon 20a and the active region 10a at the bottoms of the memory holes MH. The lower end portion of the silicon body 20b contacts the active region 10a.

For example, the cover silicon 20a and the silicon body 20b are formed as amorphous silicon films and subsequently crystallized into polycrystalline silicon films by heat treatment.

Figure 14:
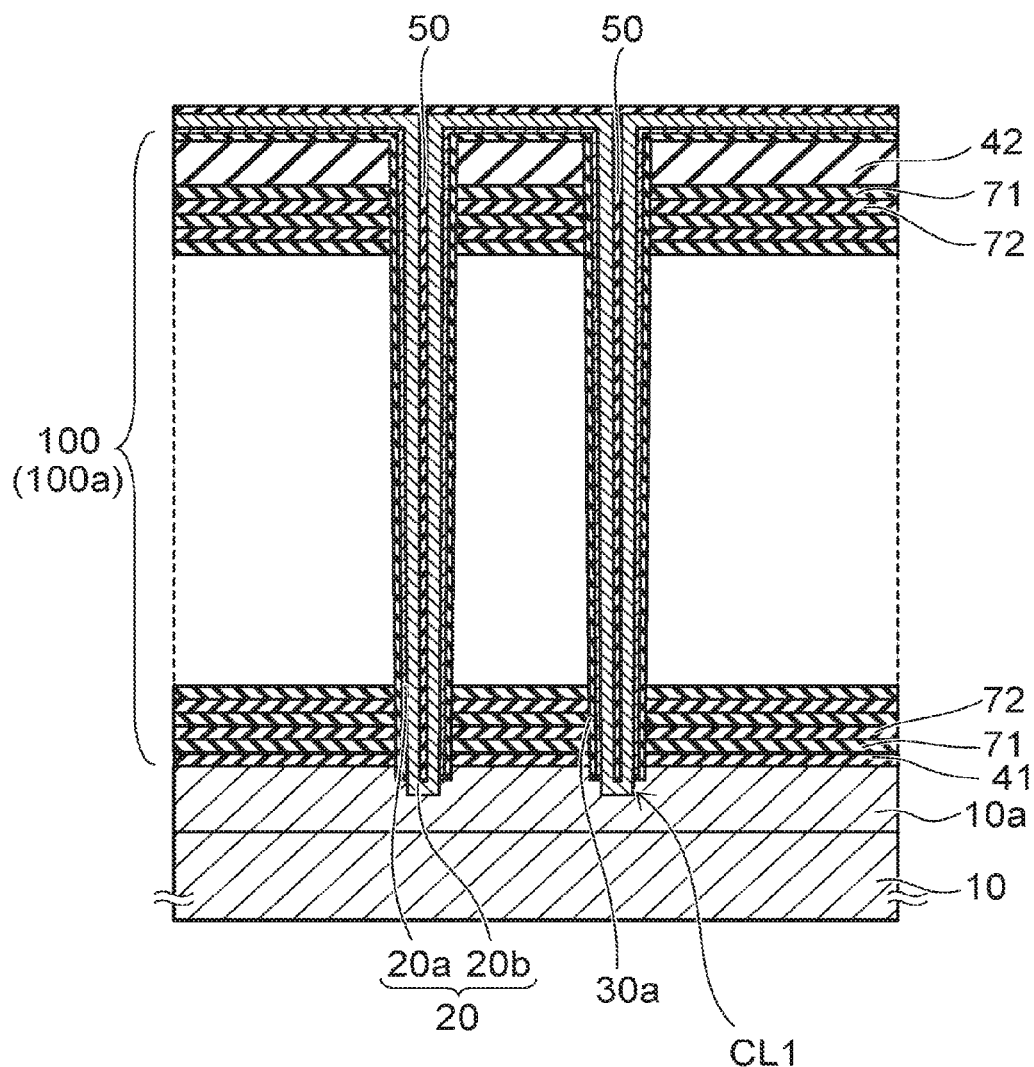

As shown in FIG. 14, the core film 50 is formed on the inner side of the silicon body 20b. The multiple first columnar portions CL1 that include the stacked film 30a, the semiconductor body 20, and the core film 50 are formed inside the first stacked portion 100a.

The films that are deposited on the insulating layer 42 shown in FIG. 14 are removed by chemical mechanical polishing (CMP) or etch-back.

Figure 15:
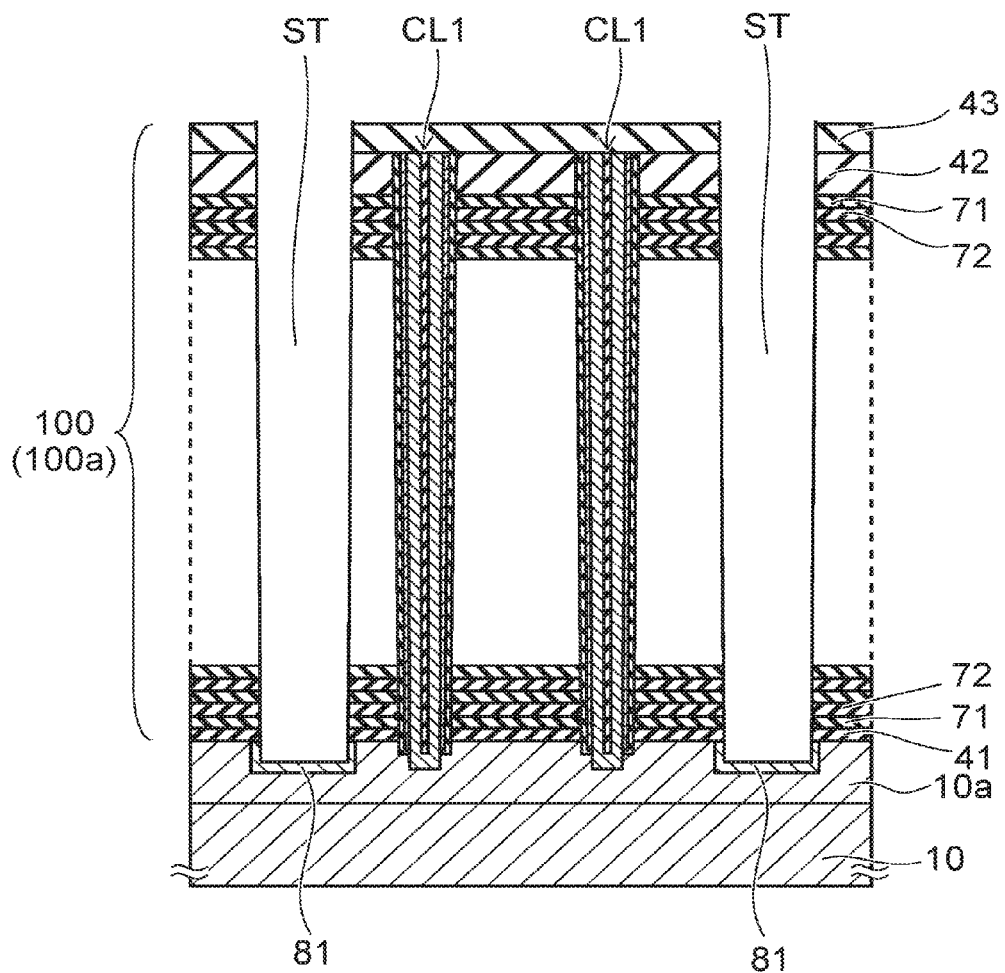

Subsequently, as shown in FIG. 15, the insulating layer 43 is formed on the insulating layer 42. The insulating layer 43 covers the upper ends of the first columnar portions CL1.

Then, multiple slits ST are formed in the first stacked portion 100a by RIE using a not-illustrated mask layer. The slits ST pierce the insulating layer 43, the insulating layer 42, the multiple sacrificial layers 71, the multiple insulating layers 72, and the insulating layer 41 and reach the active region 10a. The slits ST extend in the X-direction and are formed also in the second stacked portion 100b of the terrace region TA and the insulating layer 45 on the second stacked portion 100b.

An impurity is implanted into the active region 10a exposed at the bottoms of the slits ST by ion implantation; and the N-type semiconductor regions 81 are formed in the front surface of the active region 10a at the bottoms of the slits ST.

Then, the sacrificial layers 71 are removed using an etchant or an etching gas supplied via the slits ST. For example, the sacrificial layers 71 which are silicon nitride layers are removed using an etchant including phosphoric acid.

Figure 16:
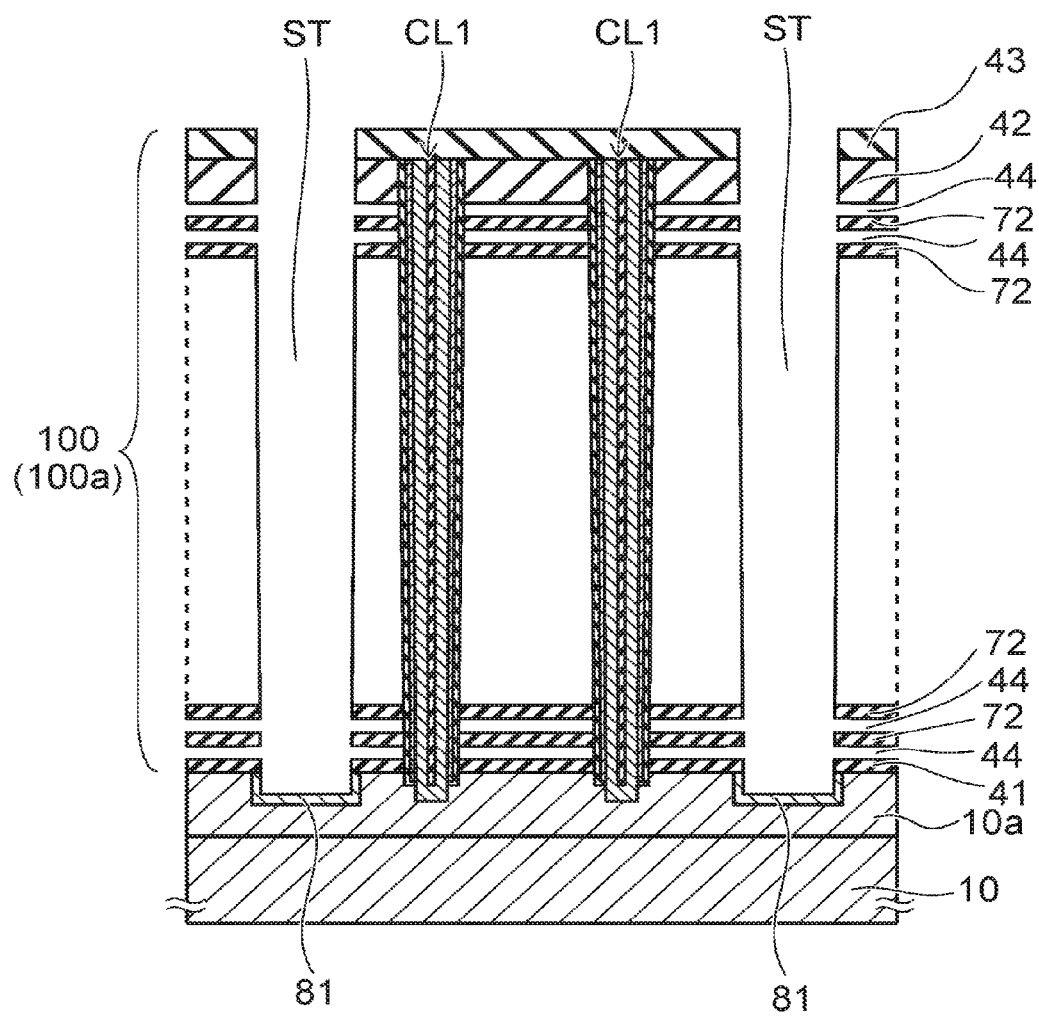

The sacrificial layers 71 are removed; and as shown in FIG. 16, a gap 44 is formed between the insulating layers 72 adjacent to each other above and below. The gap 44 is formed also between the insulating layer 41 and the insulating layer 72 of the lowermost layer and between the insulating layer 42 and the insulating layer 72 of the uppermost layer.

The multiple insulating layers 72 of the first stacked portion 100a contact the side surfaces of the multiple first columnar portions CL1 to surround the side surfaces of the first columnar portions CL1. The multiple insulating layers 72 are supported by such a physical bond with the multiple first columnar portions CL1; and the gaps 44 are maintained between the insulating layers 72.

Figure 17:
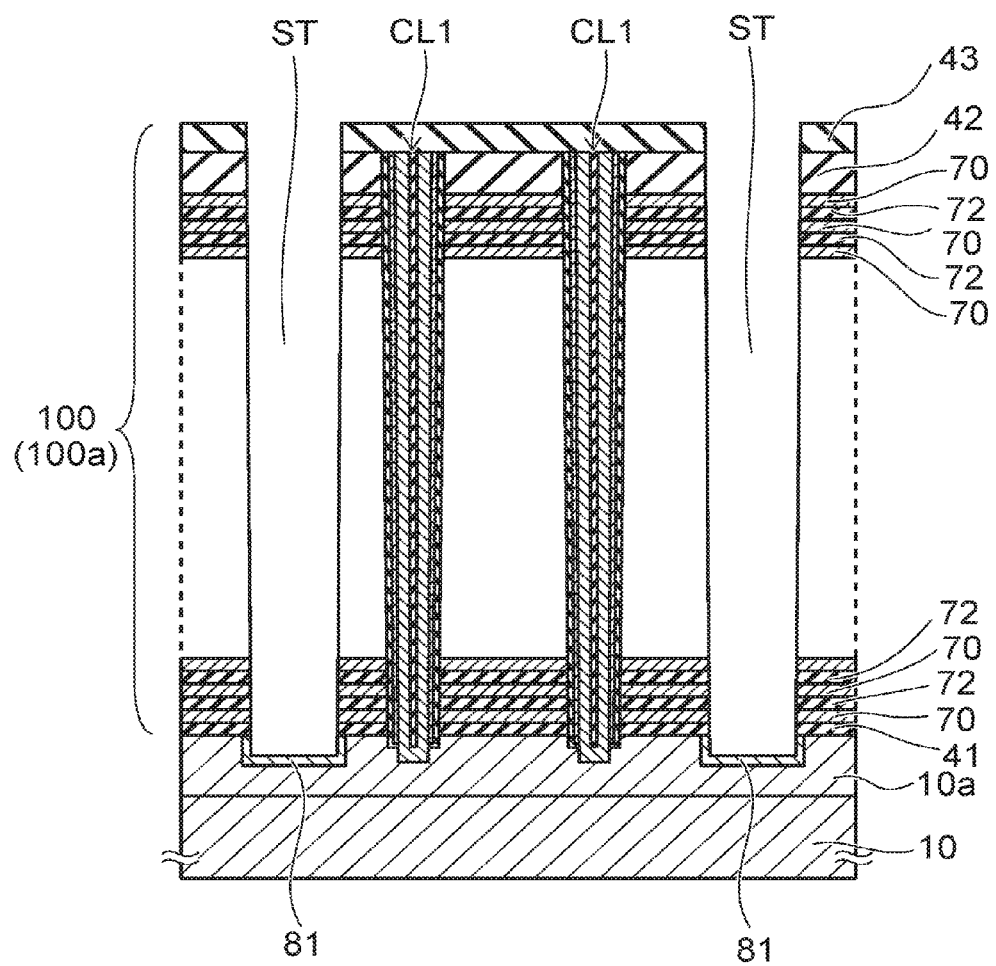

The electrode layers 70 shown in FIG. 17 are formed, with the second blocking films 35 shown in FIG. 5A interposed, in the gaps 44. For example, the second blocking films 35 and the electrode layers 70 are formed by CVD. A source gas is supplied to the gaps 44 via the slits ST. The electrode layers 70 that are formed on the side surfaces of the slits ST are removed.

Figure 18:
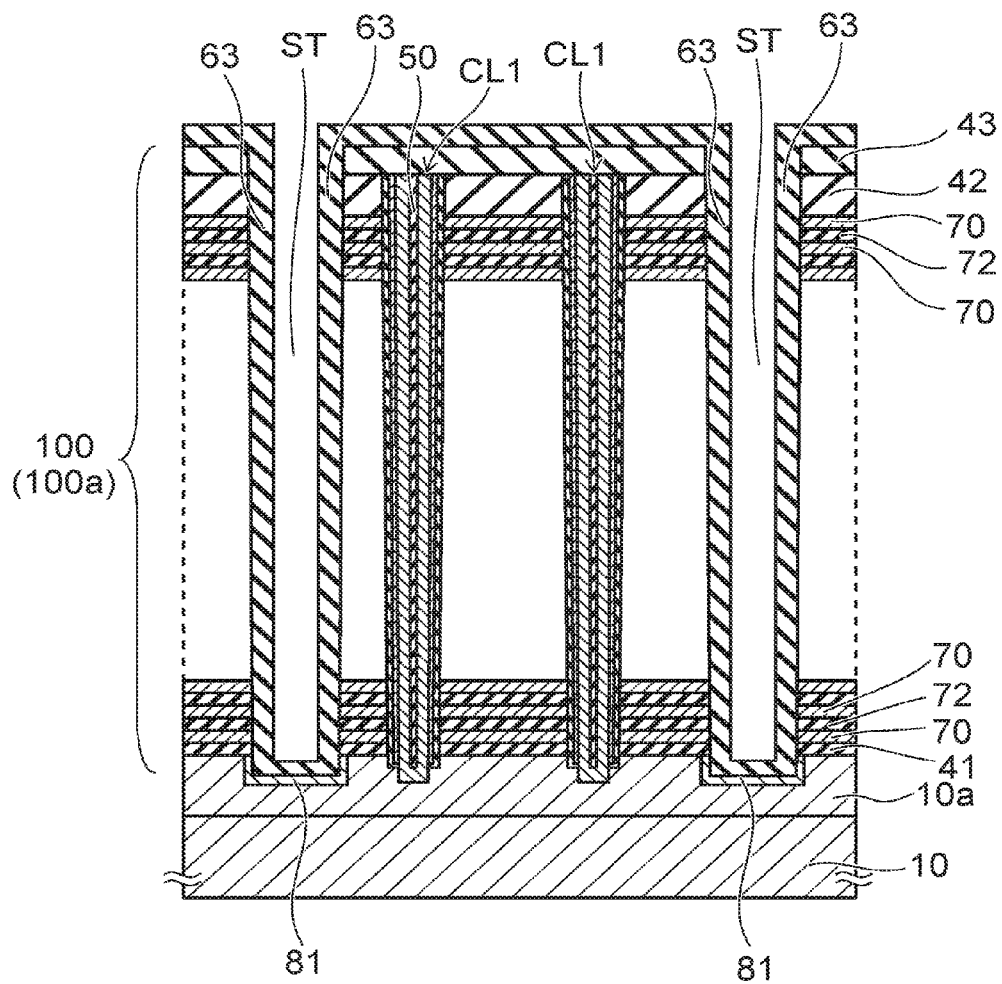

Subsequently, as shown in FIG. 18, the insulating film 63 is formed on the bottoms and side surfaces of the slits ST. After removing the insulating film 63 formed on the bottoms of the slits ST by RIE, the interconnect portion LI is filled into the inner side of the insulating film 63 inside the slits ST as shown in FIG. 4. The lower end portion of the interconnect portion LI contacts the active region 10a via the semiconductor region 81.

The processes for the second stacked portion 100b of the terrace region TA will now be described with reference to FIG. 19A to FIG. 28B.

FIG. 19B, FIG. 20B, FIG. 21B, FIG. 22B, and FIG. 23B respectively are E-E' cross-sectional views of FIG. 19A, FIG. 20A, FIG. 21A, FIG. 22A, and FIG. 23A.

Figure 19A:
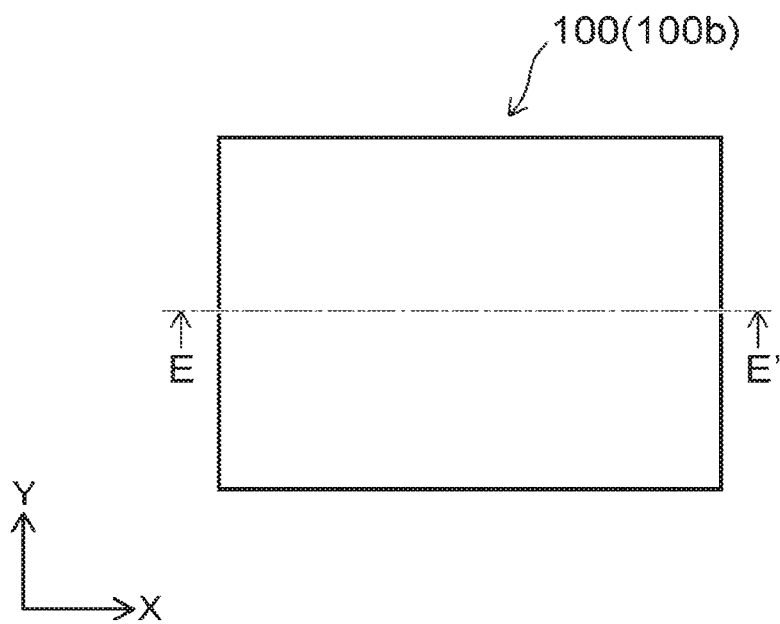
Figure 19B:
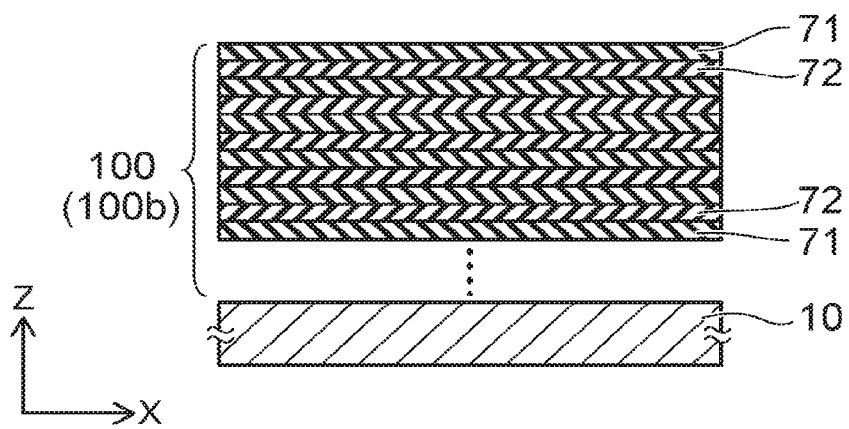
Figure 20A:
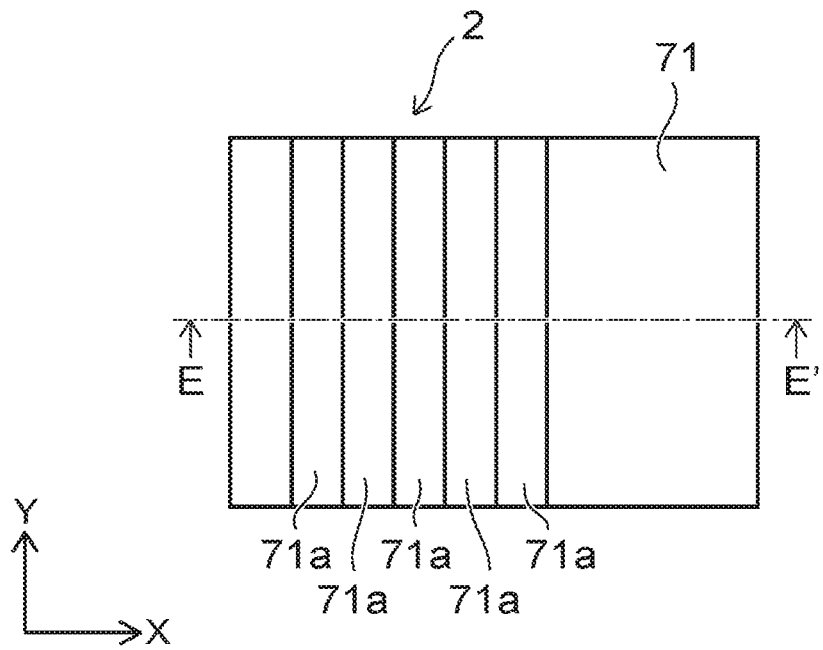
Figure 20B:
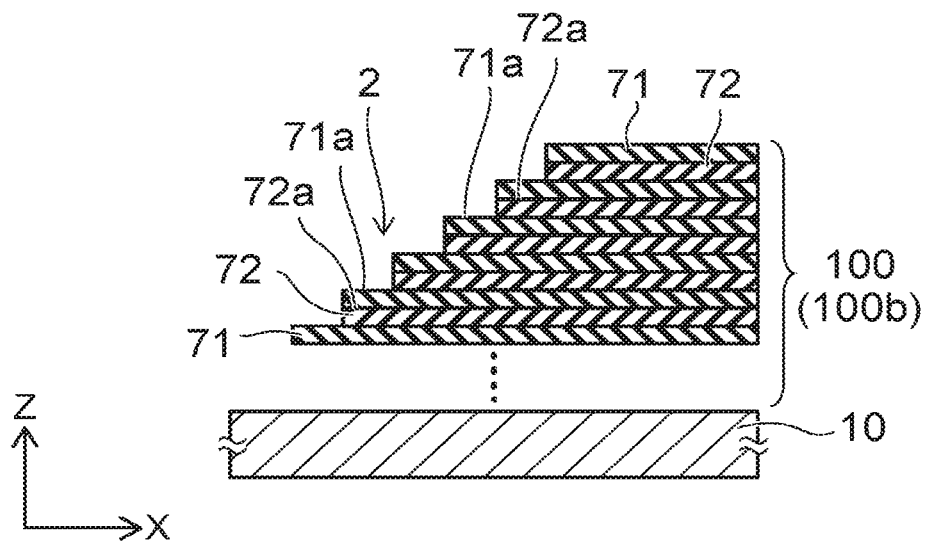

As shown in FIG. 19A and FIG. 19B, the stacked body 100 (the second stacked portion 100b) that includes the multiple first layers 71 and the multiple second layers 72 is formed also on the substrate 10 in the terrace region. As shown in FIG. 20A and FIG. 20B, the staircase portion 2 is formed in a portion of the second stacked portion 100b.

For example, RIE using a not-illustrated resist film as a mask and the reduction of the planar size of the resist film are repeated; and the multiple sacrificial layers 71 and the multiple insulating layers 72 are patterned into a staircase configuration along the X-direction. Multiple terrace portions 71a of the multiple sacrificial layers 71 are exposed at the uppermost surface of the staircase portion 2. The multiple terrace portions 71a are arranged to have a level difference in the X-direction. The terrace portions 72a of the insulating layer 72 are stacked under the terrace portions 71a.

Figure 21A:
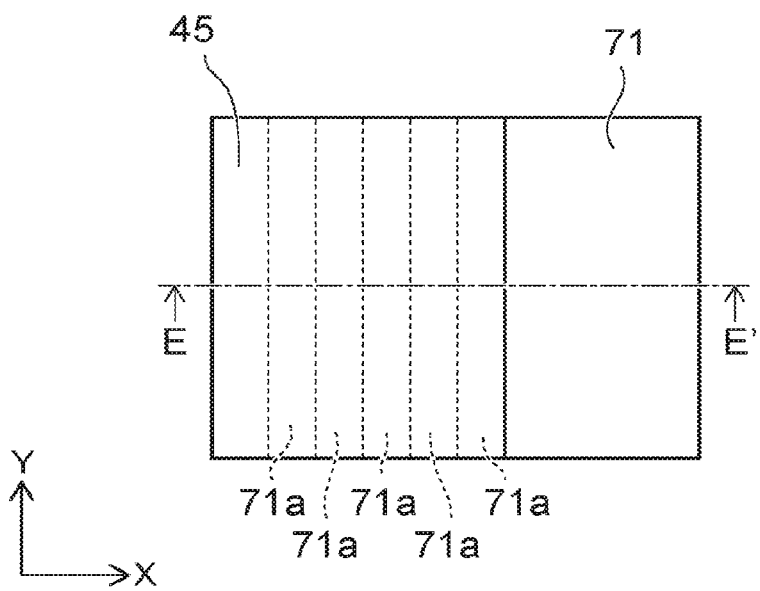
Figure 21B:
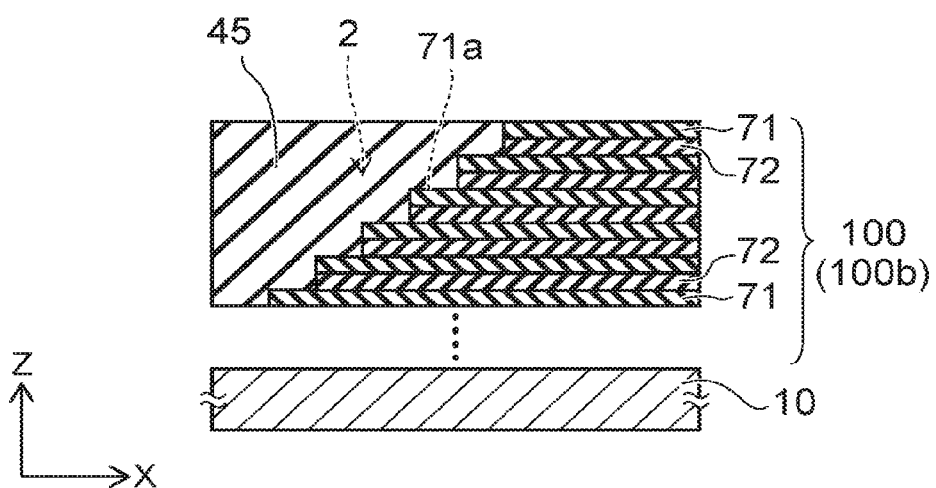

As shown in FIG. 21A and FIG. 21B, the insulating layer 45 is formed on the staircase portion 2. For example, the insulating layer (the silicon oxide layer) 45 that includes silicon oxide as a major component is formed by CVD using a gas including TEOS. The insulating layer 45 fills the level differences of the staircase portion 2; and the upper surface of the insulating layer 45 is planarized.

Figure 22A:
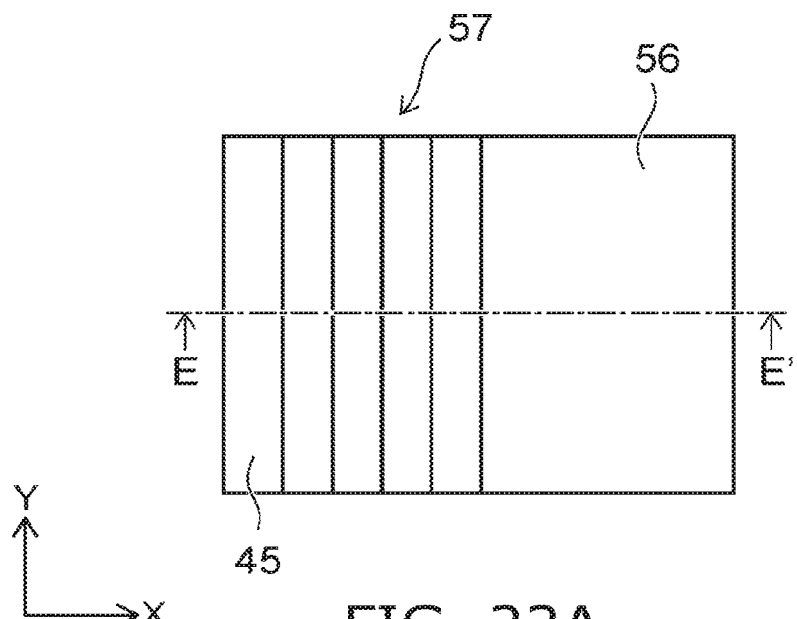
Figure 22B:
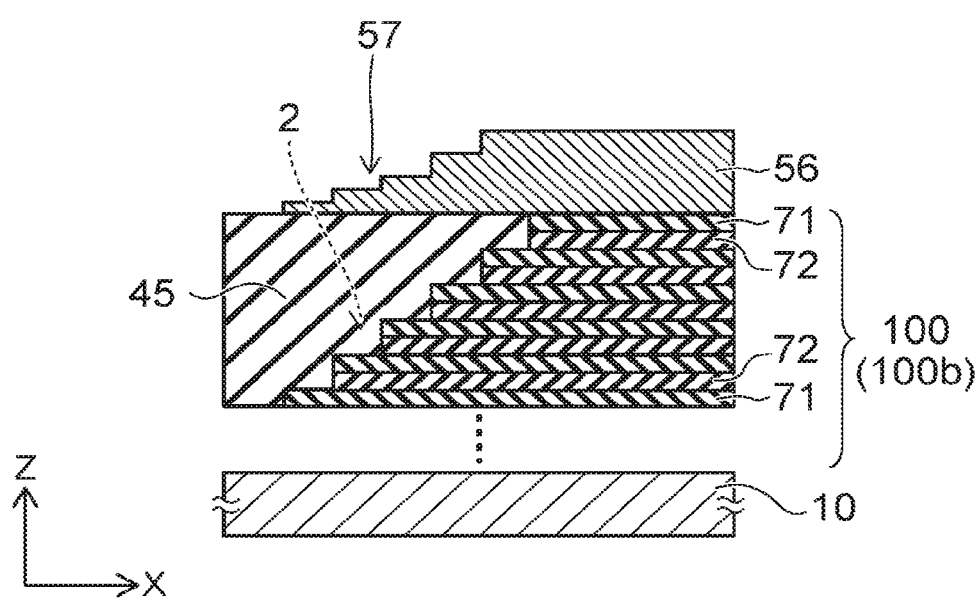

As shown in FIG. 22A and FIG. 22B, for example, a mask layer 56 is formed on the insulating layer 45 and the stacked body 100 using a resist.

A staircase portion 57 is formed in the mask layer 56 on the insulating layer 45. For example, the staircase portion 57 is formed by so-called gray-scale lithography in which the exposure amount of the mask layer 56 is controlled.

The staircase portion 57 of the mask layer 56 has a level difference along the same X-direction as the staircase portion 2 of the second stacked portion 100b. The thickness of the staircase portion 57 on the relatively thin insulating layer 45 on the upper level side of the staircase portion 2 is thicker than the thickness of the staircase portion 57 on the relatively thick insulating layer 45 on the lower level side of the staircase portion 2. The mask layer 56 may not be formed on the thick insulating layer 45 on the lower level side of the staircase portion 2.

The level differences of the staircase portion 57 are not limited to changing in the same steps as the level differences of the staircase portion 2. The thickness of the mask layer 56 may change one step every multiple steps of the change of the staircase portion 2. It is sufficient for the thickness of the mask layer 56 on the portion where the insulating layer 45 is thin to be relatively thicker than the thickness of the mask layer 56 on the portion where the insulating layer 45 is thick. The mask layer 56 on the stacked body 100 has a thickness that is not less than the thickness of the staircase portion 57.

Figure 23A:
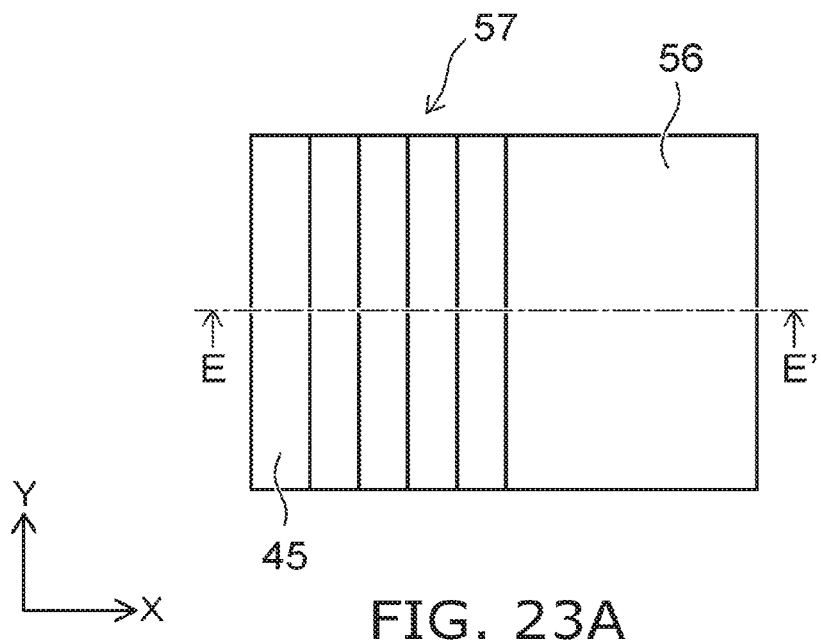
Figure 23B:
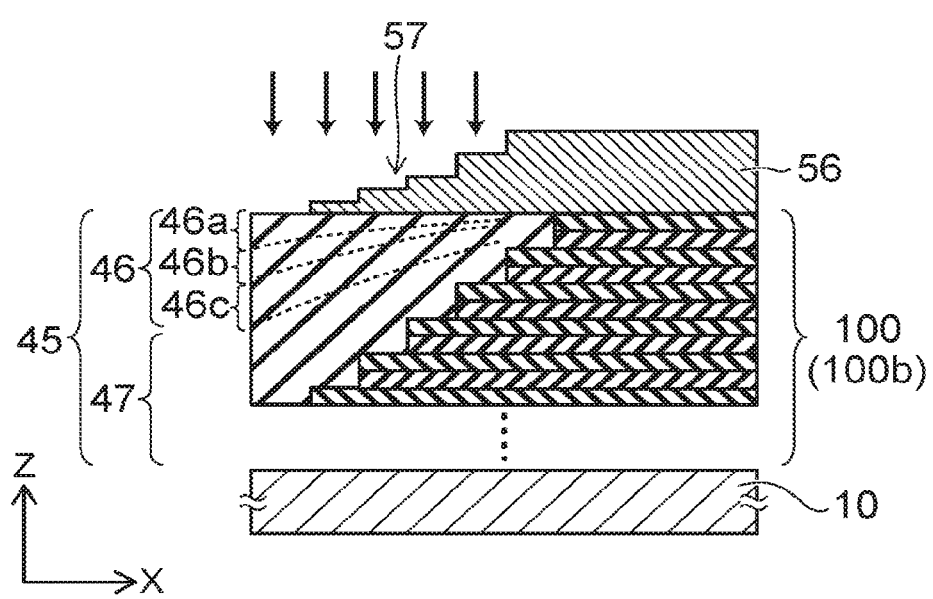

Then, by performing ion implantation using the mask layer 56, for example, carbon or nitrogen is implanted into the upper layer portion 46 of the insulating layer 45 as shown in FIG. 23A and FIG. 23B as an impurity for relatively reducing the oxygen composition ratio of the insulating layer 45.

The acceleration voltage of the impurity is not changed for positions (regions) in the X-direction. Therefore, the implantation depth of the impurity implanted into the insulating layer 45 under the region where the mask layer 56 is thin or the mask layer 56 is not formed is relatively deeper than the implantation depth of the impurity implanted into the insulating layer 45 under the region where the mask layer 56 is thick.

In the portion where the thickness of the insulating layer 45 is thick, the impurity is implanted to a position that is deeper than that of the portion where the thickness of the insulating layer 45 is thin. The impurity may be implanted more for the portion where the thickness of the insulating layer 45 is thick than for the portion where the thickness of the insulating layer 45 is thin.

The oxygen composition ratio of the upper layer portion 46 of the insulating layer 45 where the impurity is implanted is lower than the oxygen composition ratio of the lower layer portion 47 where the impurity is not introduced. The thickness of the upper layer portion 46 of the portion where the insulating layer 45 is thick is relatively thicker than the thickness of the upper layer portion 46 of the portion where the insulating layer 45 is thin.

For the insulating layer 45 in which the thickness changes in the staircase configuration along the X-direction according to the level differences of the staircase portion 2, the oxygen composition ratio of the upper layer portion 46 higher than half of the thickness can be set to be lower than the oxygen composition ratio of the lower layer portion 47 in all of the regions in the X-direction.

The formation of a change (a gradient) of the oxygen composition ratio of the insulating layer 45 such as that described above is not limited to using the mask layer 56 having the staircase portion 57 recited above. For example, the thick upper layer portion (the low-oxygen composition ratio portion) 46 also can be formed in the relatively thick portion of the insulating layer 45 by controlling the acceleration voltage and/or implantation amount of the impurity according to the position (the region) in the X-direction.

After forming the insulating layer 45, and before the impurity recited above is implanted or after the impurity is implanted, the first columnar portions CL1 are formed in the first stacked portion 100a of the memory region; and the second columnar portions CL2 are formed in the second stacked portion 100b of the terrace region. For example, the first columnar portions CL1 and the second columnar portions CL2 are formed simultaneously.

Figure 24:
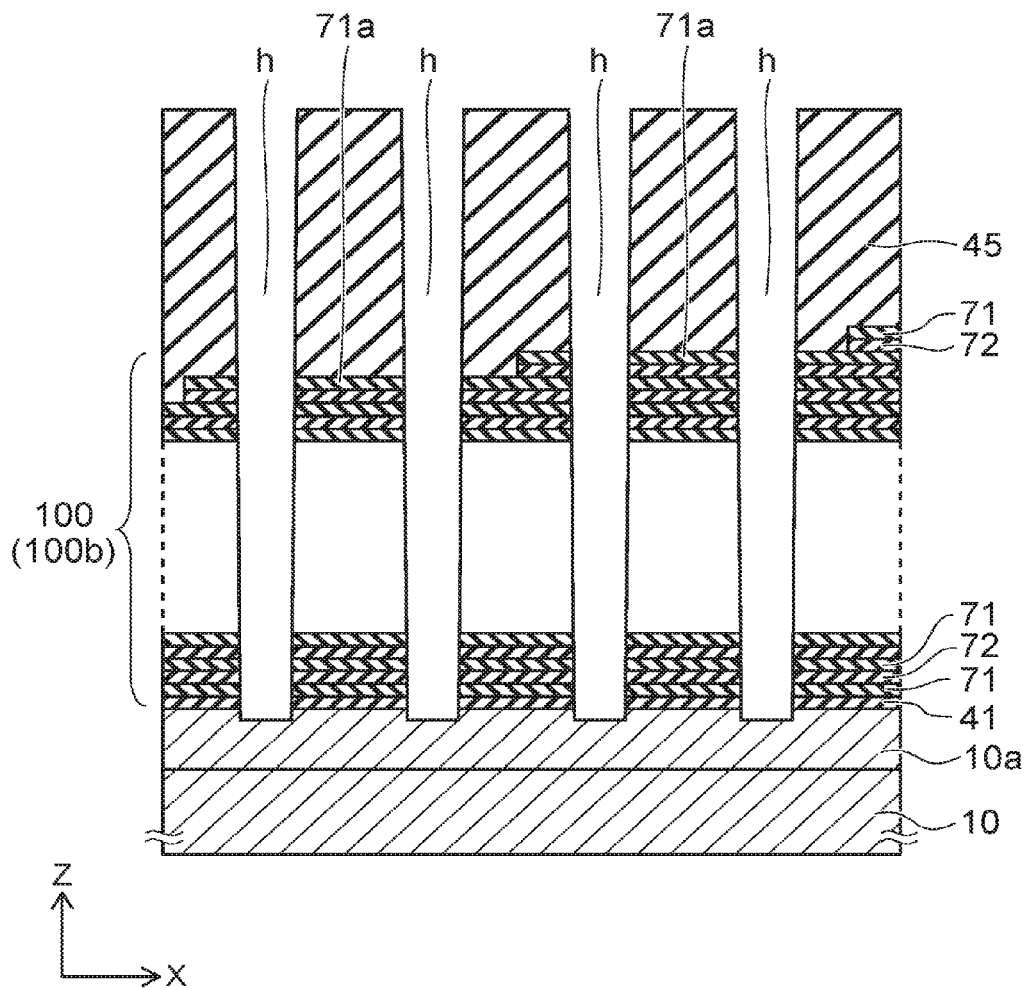

As shown in FIG. 24, multiple holes h are formed in the insulating layer 45 and in the second stacked portion 100b under the insulating layer 45. The holes h are formed simultaneously when forming the memory holes MH shown in FIG. 9. In other words, the multiple memory holes MH and the multiple holes h are formed simultaneously by RIE. The holes h extend through the insulating layer 45 and through the second stacked portion 100b in the Z-direction and reach the substrate 10. The second columnar portions CL2 that have the same film structure as the first columnar portions CL1 inside the memory holes MH are formed also inside the holes h.

Subsequently, the slits ST that extend in the X-direction are formed in the stacked body including the first stacked portion 100a of the memory region MA and the second stacked portion 100b and the insulating layer 45 of the terrace region TA.

Figure 25A:
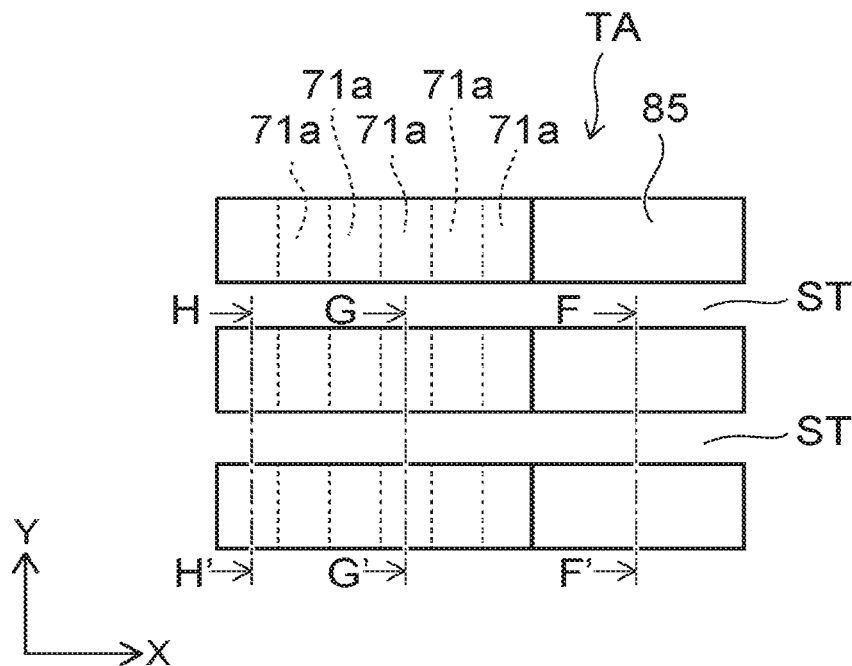

The slits ST that are formed in the terrace region TA are shown in FIG. 25A.

Figure 25B:
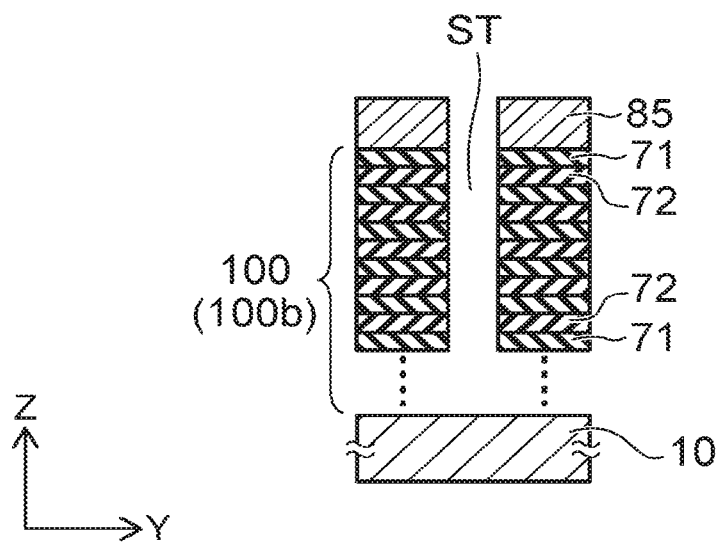

FIG. 25B is an F-F' cross-sectional view of FIG. 25A.
FIG. 26A is a G-G' cross-sectional view of FIG. 25A.
FIG. 26B is an H-H' cross-sectional view of FIG. 25A.

For example, the slits ST are formed by RIE using a mask layer 85. For example, the insulating layer 45 and the stacked body 100 including the first layers 71 and the second layers 72 are etched collectively by RIE using a CF-based gas.

A film of a CF-based polymer is formed as a protective film on the side wall of the slit ST to suppress side etching in the RIE using the CF-based gas. Generally, when etching an oxide film by RIE using a CF-based gas, the oxygen inside the film easily bonds with the carbon of the etching gas and volatilizes; and the CF-based polymer film for the side wall protection easily becomes insufficient. In particular, side etching of the insulating layer 45 which is a single-layer film of an oxide film progresses easily compared to the stacked body 100; and the cross-sectional configuration of the slit ST formed in the insulating layer 45 easily has a so-called bowed configuration. The bowing occurs easily in the portion of the slit ST higher than the position of half in the depth direction. In other words, the portion of the slit ST where the slit width is a maximum easily occurs higher than the position of half in the depth direction.

According to the embodiment as shown in FIG. 23B, the oxygen composition ratio of the upper layer portion 46 of the insulating layer 45 where the bowing occurs easily is reduced to be lower than that of the lower layer portion 47. The thickness (the volume) of the upper layer portion (the low-oxygen composition ratio portion) 46 on the lower level side where the insulating layer 45 is thick is set to be thicker than the portion where the insulating layer 45 is thin (the upper level side) by the amount that the insulating layer 45 is thicker.

By reducing the oxygen composition ratio of all of the elements inside the upper layer portion 46 of the insulating layer 45, the oxygen desorption amount from the upper layer portion 46 of the insulating layer 45 can be reduced inside the RIE forming the slit ST; and the side etching can be suppressed. Accordingly, the bowed configuration of the insulating layer 45 can be suppressed; and the fluctuation of the width of the slits ST formed in all of the regions including the stacked body 100 of the memory region MA can be suppressed.

The improvement of the controllability of the width of the slit ST makes the surface area reduction of the terrace portions 70a shown in FIG. 2 possible; and this allows the reduction of the chip size.

Figure 27A:
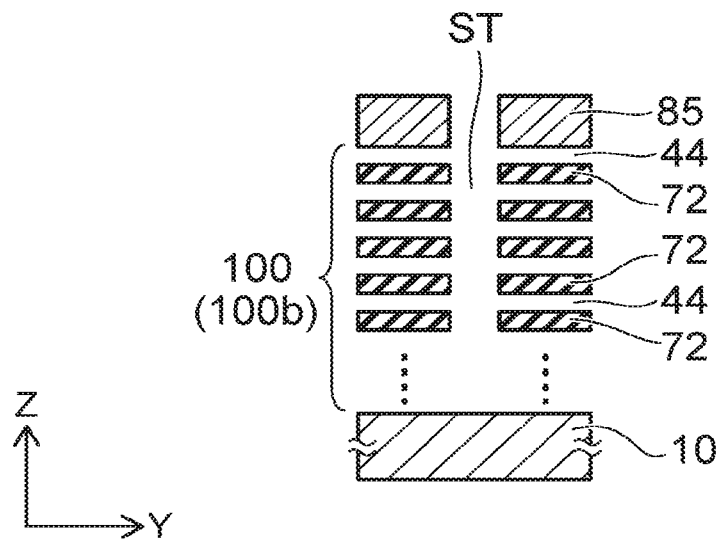

After forming the slits ST, the sacrificial layers 71 of the second stacked portion 100b and the first stacked portion 100a are removed using, for example, an etchant including phosphoric acid supplied via the slits ST as described above. The sacrificial layers 71 are removed; and the gaps 44 are formed also in the second stacked portion 100b as shown in FIG. 27A.

The multiple insulating layers 72 of the second stacked portion 100b contact the side surfaces of the multiple second columnar portions CL2 formed in the terrace region TA described above to surround the side surfaces of the second columnar portions CL2. The multiple insulating layers 72 are supported by such a physical bond with the multiple second columnar portions CL2; and the gaps 44 are maintained between the insulating layers 72.

Figure 27B:
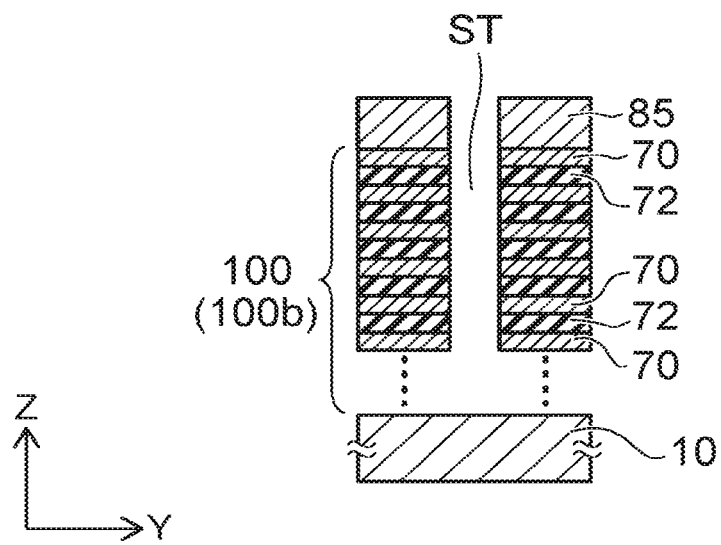

Then, the electrode layers 70 are formed also in the gaps 44 of the second stacked portion 100b as shown in FIG. 27B simultaneously when forming the electrode layers 70 in the gaps 44 of the first stacked portion 100a.

Subsequently, the interconnect portions LI are formed, with the insulating films 63 interposed, also inside the slits ST of the terrace region TA.

Figure 28A:
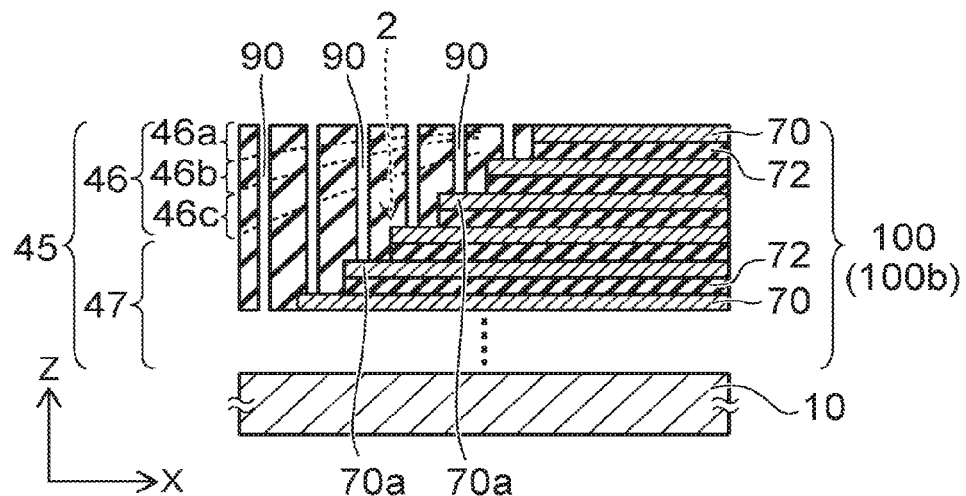

Subsequently, as shown in FIG. 28A, contact holes 90 are formed inside the insulating layer 45. The contact holes 90 extend through the insulating layer 45 in the Z-direction and reach the terrace portions 70a of the electrode layers 70.

Figure 28B:
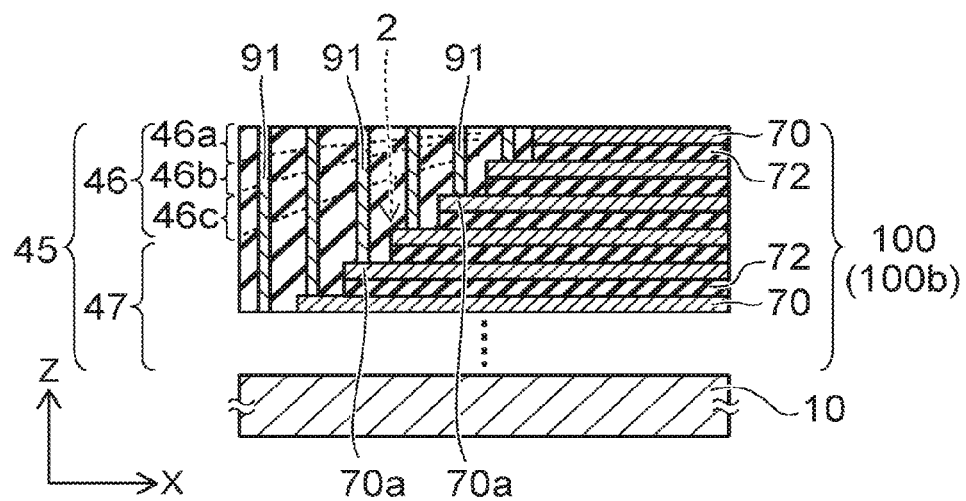

As shown in FIG. 28B, a conductive material that includes a metal is filled into the contact holes 90; and the contact portions 91 are formed.

Similarly to the formation of the slits ST, the contact holes 90 also are formed by RIE using, for example, a CF-based gas. In the RIE forming the contact holes 90 as well, the side etching due to the desorption of the oxygen from the upper layer portion 46 of the insulating layer 45 can be suppressed. Accordingly, the bowed configuration of the contact holes 90 can be suppressed.

Similarly, the holes h shown in FIG. 24 where the second columnar portions CL2 are formed also are formed by RIE using, for example, a CF-based gas. In the RIE forming the holes h as well, the side etching due to the desorption of the oxygen from the upper layer portion 46 of the insulating layer 45 can be suppressed. Accordingly, the bowed configuration of the holes h inside the insulating layer 45 can be suppressed.

The suppression of the bowed configurations of the contact holes 90 and/or the holes h increases the degrees of freedom of the layout of the contact holes 90 and the holes h inside the terrace portions.

Figure 29:
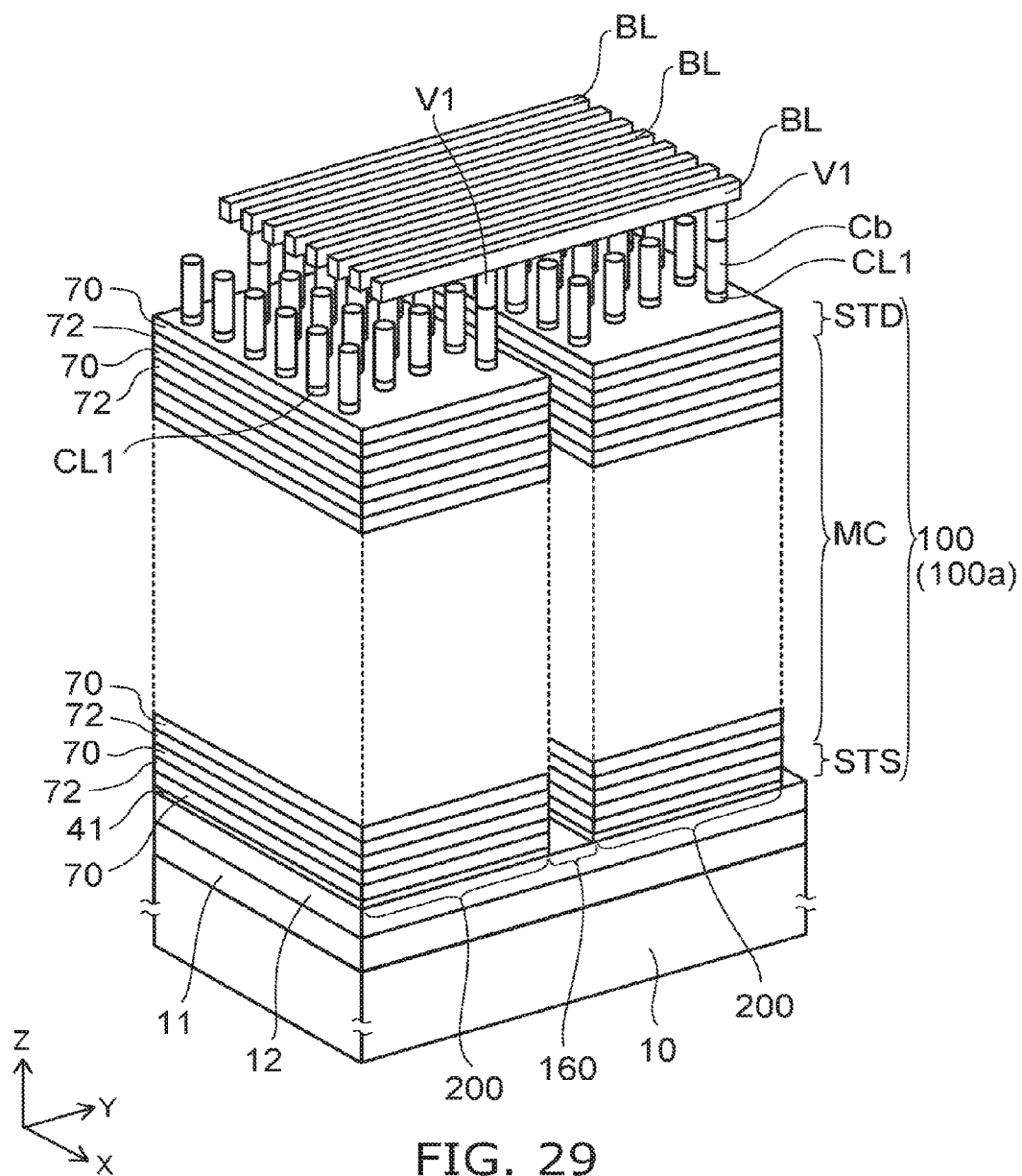
FIG. 29 is a schematic perspective view of the memory cell array of the semiconductor device of the embodiment.

FIG. 29 is a schematic perspective view of another example of the memory cell array of the embodiment.

A first foundation layer 11 and a second foundation layer 12 are provided between the substrate 10 and the stacked body 100 (the first stacked portion 100a). The first foundation layer 11 is provided between the substrate 10 and the second foundation layer 12; and the second foundation layer 12 is provided between the first foundation layer 11 and the stacked body 100.

The second foundation layer 12 is a semiconductor layer or a conductive layer. Or, the second foundation layer 12 may include a stacked film of a semiconductor layer and a conductive layer. The first foundation layer 11 includes transistors and interconnects forming a control circuit.

The lower ends of the semiconductor bodies 20 of the first columnar portions CL1 contact the second foundation layer 12; and the second foundation layer 12 is connected to the control circuit. Accordingly, the lower ends of the semiconductor bodies 20 of the first columnar portions CL1 are electrically connected to the control circuit via the second foundation layer 12. In other words, the second foundation layer 12 can be used as a source layer.

The stacked body 100 is divided into the multiple blocks (or finger portions) 200 in the Y-direction by a separation portion 160. The separation portion 160 is an insulating film and does not include an interconnect.

Although silicon nitride layers are illustrated in the embodiments recited above as the first layers 71, metal layers (e.g., tungsten layers or molybdenum layers) may be used as the first layers 71. In such a case, the first layers 71 become the electrode layers 70 as-is; therefore, the process of replacing the first layers 71 with the electrode layers is unnecessary.

Also, the second layers 72 may be removed by etching via the slits ST; and gaps may be formed between the electrode layers 70 adjacent to each other above and below.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a foundation layer;
   a stacked body provided on the foundation layer, the stacked body including a plurality of electrode layers stacked with an insulator interposed, the stacked body including a first stacked portion and a second stacked portion, the plurality of electrode layers of the second stacked portion having a plurality of terrace portions arranged in a staircase configuration by forming a level difference in a first direction; and
   an insulating layer provided on the plurality of terrace portions and covering the level difference, the insulating layer including silicon oxide as a major component, the insulating layer having a difference of an oxygen composition ratio in a thickness direction of the insulating layer, the insulating layer including an upper layer portion and a lower layer portion, an oxygen composition ratio of the upper layer portion being lower than an oxygen composition ratio of the lower layer portion.

2. The semiconductor device according to claim 1, wherein a carbon concentration of the upper layer portion is higher than a carbon concentration of the lower layer portion.

3. The semiconductor device according to claim 1, wherein a nitrogen concentration of the upper layer portion is higher than a nitrogen concentration of the lower layer portion.

4. The semiconductor device according to claim 1, wherein a thickness of the upper layer portion on a terrace portion on a lower level side of the plurality of terrace portions arranged in the staircase configuration is thicker than a thickness of the upper layer portion on a terrace portion on an upper level side of the plurality of terrace portions.

5. The semiconductor device according to claim 1, further comprising a plurality of contact portions extending through the insulating layer in a stacking direction of the stacked body and being in contact with the plurality of terrace portions.

6. The semiconductor device according to claim 1, further comprising a first columnar portion extending through the first stacked portion in a stacking direction of the stacked body, the first columnar portion including a semiconductor body and a charge storage portion, the semiconductor body contacting the foundation layer, the charge storage portion being provided between the semiconductor body and one of the electrode layers.

7. The semiconductor device according to claim 1, further comprising a second columnar portion extending through the insulating layer and through the second stacked portion in a stacking direction of the stacked body.

8. The semiconductor device according to claim 1, further comprising a separation portion extending in the first direction and dividing the first stacked portion, the insulating layer, and the second stacked portion in a second direction crossing the first direction.

9. The semiconductor device according to claim 8, wherein the separation portion includes an interconnect portion contacting the foundation layer.

10. The semiconductor device according to claim 1, further comprising:
    a plurality of first columnar portions extending through the first stacked portion in a stacking direction of the stacked body, the first columnar portions including a semiconductor body and a charge storage portion, the semiconductor body contacting the foundation layer, the charge storage portion being provided between the semiconductor body and one of the electrode layers; and
    a plurality of second columnar portions extending through the insulating layer and through the second stacked portion in the stacking direction,
    the plurality of first columnar portions being arranged more densely than the plurality of second columnar portions.

11. A method for manufacturing a semiconductor device, comprising:
    forming a stacked body on a foundation layer, the stacked body including a plurality of first layers and a plurality of second layers, the first layers and the second layers including a first layer and a second layer stacked alternately;

forming a staircase portion in a portion of the stacked body to cause the plurality of first layers to have a plurality of terrace portions arranged in a staircase configuration by forming a level difference in a first direction;

forming an insulating layer on the staircase portion to cover the level difference, the insulating layer including silicon oxide as a major component, the insulating layer having a difference of an oxygen composition ratio in a thickness direction of the insulating layer, the insulating layer including an upper layer portion and a lower layer portion, an oxygen composition ratio of the upper layer portion being lower than an oxygen composition ratio of the lower layer portion; and forming a slit in the stacked body and the insulating layer.

12. The method for manufacturing the semiconductor device according to claim 11, wherein the oxygen composition ratio of the upper layer portion is set to be lower than the oxygen composition ratio of the lower layer portion by introducing carbon or nitrogen to the upper layer portion of the insulating layer.

13. The method for manufacturing the semiconductor device according to claim 11, wherein the slit extends in the first direction and divides the stacked body and the insulating layer in a second direction crossing the first direction.

14. The method for manufacturing the semiconductor device according to claim 11, further comprising forming a plurality of contact portions extending through the insulating layer in a stacking direction of the stacked body and being in contact with the plurality of terrace portions.

15. A method for manufacturing a semiconductor device, comprising:

forming a stacked body on a foundation layer, the stacked body including a plurality of first layers and a plurality of second layers, the first layers and the second layers including a first layer and a second layer stacked alternately;

forming a staircase portion in a portion of the stacked body to cause the plurality of first layers to have a plurality of terrace portions arranged in a staircase configuration by forming a level difference in a first direction;

forming an insulating layer on the staircase portion to cover the level difference, the insulating layer including silicon oxide as a major component, the insulating layer having a difference of an oxygen composition ratio in a thickness direction of the insulating layer, the insulating layer including an upper layer portion and a lower layer portion, an oxygen composition ratio of the upper layer portion being lower than an oxygen composition ratio of the lower layer portion; and forming a hole in the insulating layer.

16. The method for manufacturing the semiconductor device according to claim 15, wherein the oxygen composition ratio of the upper layer portion is set to be lower than the oxygen composition ratio of the lower layer portion by introducing carbon or nitrogen to the upper layer portion of the insulating layer.

17. The method for manufacturing the semiconductor device according to claim 15, wherein the forming of the hole includes forming a plurality of contact holes reaching the plurality of terrace portions and extending through the insulating layer in a stacking direction of the stacked body.

18. The method for manufacturing the semiconductor device according to claim 15, wherein the forming of the hole includes forming a plurality of first holes reaching the foundation layer and extending through the insulating layer and through the stacked body under the insulating layer in a stacking direction of the stacked body.

19. The method for manufacturing the semiconductor device according to claim 18, further comprising forming a columnar portion inside the first holes and subsequently forming a slit extending in the first direction, the slit dividing the stacked body and the insulating layer in a second direction crossing the first direction.

20. The method for manufacturing the semiconductor device according to claim 19, further comprising:

forming a gap between the plurality of second layers by removing the plurality of first layers by etching via the slit; and forming an electrode layer in the gap.

* * * * *